(12) United States Patent
Santhanam

(10) Patent No.: US 6,380,511 B1
(45) Date of Patent: *Apr. 30, 2002

(54) LASER WELDED INKJET PRINTHEAD ASSEMBLY UTILIZING A COMBINATION LASER AND FIBER OPTIC PUSH CONNECT SYSTEM

(75) Inventor: Ram Santhanam, San Diego, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/198,426

(22) Filed: Nov. 24, 1998

Related U.S. Application Data

(62) Division of application No. 08/705,928, filed on Aug. 30, 1996, now Pat. No. 5,847,365.

(51) Int. Cl.[7] .............................................. B23K 26/20
(52) U.S. Cl. ............................ 219/121.64; 228/180.22
(58) Field of Search ..................... 219/121.63, 121.64, 219/121.82, 121.85; 156/272.8; 427/554, 555, 556, 596, 597; 29/890.1; 228/180.22, 180.21

(56) References Cited

U.S. PATENT DOCUMENTS

| | | | | |
|---|---|---|---|---|
| 4,970,365 A | * | 11/1990 | Chalco .................. | 219/121.63 |
| 4,978,835 A | * | 12/1990 | Luijtjes et al. ......... | 219/121.64 |
| 5,055,652 A | * | 10/1991 | Jones et al. ............ | 219/121.64 |
| 5,274,210 A | * | 12/1993 | Freedman et al. ..... | 219/121.63 |
| 5,337,383 A | * | 8/1994 | DeAngelis et al. .......... | 385/49 |
| 5,442,384 A | * | 8/1995 | Schantz et al. ............... | 347/20 |
| 5,847,356 A | * | 12/1998 | Santhanam ............ | 219/121.64 |

FOREIGN PATENT DOCUMENTS

| | | | | |
|---|---|---|---|---|
| DE | 4200492 | 4/1993 | ........... | B23K/26/02 |
| FR | 2740648 | 4/1997 | ............ | H05K/3/34 |

* cited by examiner

Primary Examiner—Samuel M. Heinrich
(74) Attorney, Agent, or Firm—Dennis G. Stenstrom

(57) ABSTRACT

The disclosure describes a method for the solderless laser welding of two materials by using a laser light beam attached to a fiber optic system which directs the light to a region where the laser beam can shine through one of the materials to create a seam weld. By using a fiber optic system the laser beam is optimally converted into thermal energy and weld flaws due to underheating or destruction of the materials due to overheating does not occur. The method and apparatus provide rapid, reproducible laser welding even for the smallest of contact geometries. For example, the method results in solderless gold-to-gold compression laser welding of a silicon substrate to the material contained in a polymer flex circuit tape, such as a polyimide, without damaging the tape. A strong solderless gold-to-gold bond can be formed between a gold bond line, or complex weld seam pattern, on the flex circuit tape and a mating gold bond line or weld seam pattern on a semiconductor chip. Such a bond is formed without any damage to the tape and prevents delamination and nozzle skewing during the adhesive curing process of other methods. The reduced nozzle skewing provides less dot placement error for print cartridges, and therefore better print quality. Disclosed is an improved printhead configuration for facilitating the attachment of a nozzle member to the substrate which increases nozzle area stiffness and nozzle camber angle and directionality as well as, the substrate/tape interface bond strength, and reduces deformation of the nozzle member. The configuration thereby provides higher consistent ink chamber refill speeds, and reduces ink trajectory errors and delamination. In addition, in particular embodiments increased tolerance to aggressive solvents in inks and more consistent chamber geometry result in better control over drop volume. The method improves the quality, repeatability and reliability of the pen and results in fewer process steps, thereby improving processing time, cost and reduced in-process handling. The above in turn results in ease of assembly, higher yields, improved reliability, ease of nozzle serviceability, and overall material and manufacturing cost reduction.

27 Claims, 22 Drawing Sheets

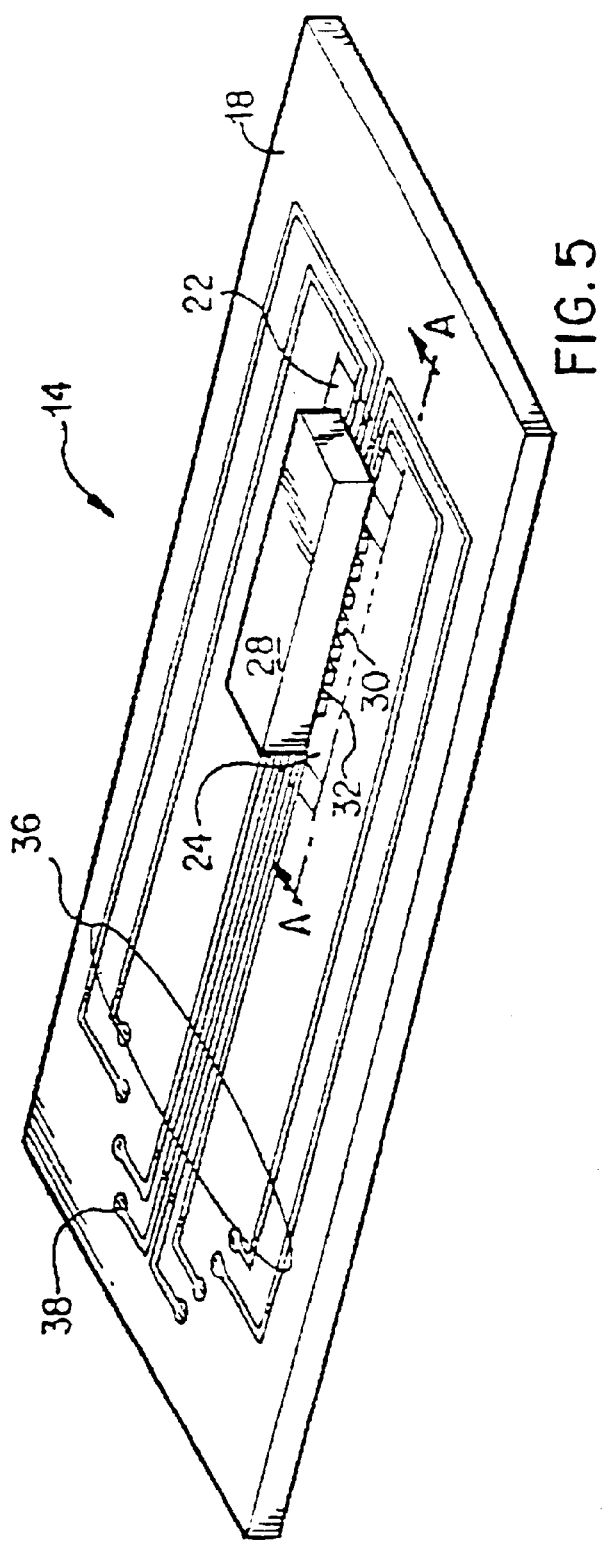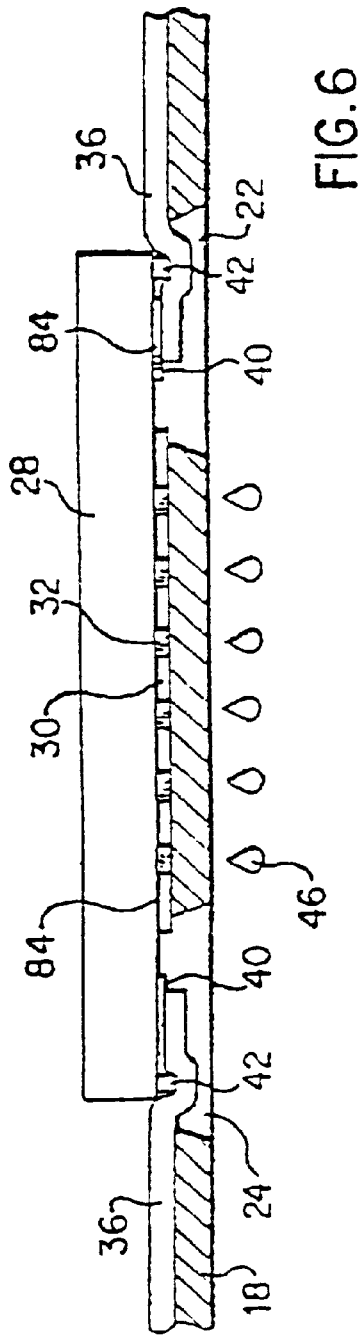

LASER WELDED INKJET PRINTHEAD ASSEMBLY UTILIZING A COMBINATION LASER AND FIBER OPTIC PUSH CONNECT SYSTEM

CROSS-REFERENCE TO RELATED APPLICATIONS

This is a divisional of application Ser. No. 08/705,928 filed on Aug. 30, 1996, and which is now U.S. Pat. No. 5,347,355.

This application relates to the subject matter disclosed in the following U.S. Patents and co-pending U.S. Applications:

U.S. patent application Ser. No. 08/558,567, filed Oct. 31, 1995, entitled "Solderless Connection of Electrical Contacts Utilizing Combination Laser and Fiber Optic Push Connect System", now abandoned;

U.S. patent application Ser. No. 08/550,328, filed Oct. 30, 1995, entitled "Inkjet Printhead with Trench and Backward Peninsulas", now U.S. Pat. No. 5,685,074;

U.S. patent application Ser. No. 08/550,427, filed Oct. 30, 1995, entitled "Inkjet Printhead with Channels Connecting Trench and Firing Chambers", now U.S. Pat. No. 5,755,032;

U.S. patent application Ser. No. 08/131,816, filed Oct. 5, 1993, entitled "Inkjet Printhead Formed to Eliminate Ink Trajectory Errors" now U.S. Pat. No. 5,467,115, which is a continuation-in-part of U.S. Pat. No. 5,450,113, entitled "Adhesive Seal for an Inkjet Printhead."

U.S. Pat. No. 5,442,384, entitled "Integrated Nozzle Member and TAB Circuit for Inkjet Printhead;" and U.S. Pat. No. 5,278,584, entitled "Ink Delivery System for an Inkjet Printhead."

The above patent and co-pending applications are assigned to the present assignee and are incorporated herein by reference.

FIELD OF THE INVENTION

The present invention generally relates to the adhesiveless laser welding of two nonmetallic materials, preferably but not necessarily and, more particularly, to the laser welding of two materials using an optical fiber that holds the materials in contact while directing a laser emission to the pattern area to be welded.

BACKGROUND OF THE INVENTION

Thermal inkjet print cartridges operate by rapidly heating a small volume of ink to cause the ink to vaporize and be ejected through one of a plurality of orifices so as to print a dot of ink on a recording medium, such as a sheet of paper. Alternatively, a piezoelectric element may be used to eject a droplet of ink through an associated orifice onto the paper. The properly sequenced ejection of ink from each orifice causes characters or other images to be printed upon the paper as the printhead is moved relative to the paper.

An inkjet printhead generally includes: (1) ink channels to supply ink from an ink reservoir to each ejection chamber proximate to an orifice; (2) a metal orifice plate or nozzle member in which the orifices are formed in the required pattern; and (3) a silicon substrate containing a series of ink ejection elements, one ejection element per ink ejection chamber.

To print a single dot of ink, an electrical current from an external power supply is passed through a selected thin film resistor. The resistor is then heated, in turn superheating a thin layer of the adjacent ink within a vaporization chamber, causing explosive vaporization, and, consequently, causing a droplet of ink to be ejected through an associated orifice onto the paper. Alternatively, a piezoelectric element may be used to eject a droplet of ink through an associated orifice onto the paper.

In U.S. application Ser. No. 07/862,668, filed Apr. 2, 1992, entitled "Integrated Nozzle Member and TAB Circuit for Inkjet Printhead," a novel nozzle member for an inkjet print cartridge and method of forming the nozzle member are disclosed. This integrated nozzle and tab circuit design is superior to the orifice plates for inkjet printheads formed of nickel and fabricated by lithographic electroforming processes. A barrier layer formed on the substrate includes ejection chambers, surrounding each orifice, and ink flow channels which provide fluid communication between a ink reservoir and the ejection chambers. A flexible tape having conductive traces formed thereon has formed in it nozzles or orifices by Excimer laser ablation. By providing the orifices in the flexible circuit itself, the shortcomings of conventional electroformed orifice plates are overcome. The resulting nozzle member having orifices and conductive traces may then have mounted on it the substrate and barrier layer containing ink ejection elements associated with each of the orifices. Additionally, the orifices may be formed aligned with the conductive traces on the nozzle member so that alignment of electrodes on a substrate with respect to ends of the conductive traces also aligns the ejection elements with the orifices. The leads at the end of the conductive traces formed on the back surface of the nozzle member are then connected to the electrodes on the substrate and provide energization signals for the ejection elements. The above procedure is known as Tape Automated Bonding ("TAB") of an inkjet printhead assembly, or TAB Head Assembly, (hereinafter referred to as a "THA")

An existing solution for attaching a nozzle member having orifices to a substrate, containing ink ejection chambers and ink ejection elements, is to adhesively affix the top surface of the substrate's barrier layer to the back surface of the flexible circuit using a thin adhesive layer, such as an uncured layer of poly-isoprene photoresist, applied to the top surface of the barrier layer. A separate adhesive layer may not be necessary if the top of the barrier layer can be otherwise be made adhesive. The resulting substrate structure is then positioned with respect to the back surface of the flexible circuit so as to align the ink ejection chambers with the orifices formed in the flexible circuit. After the above-described preliminary adhesively-affixing step and the previously mentioned electrical-lead TAB bonding step, the aligned and bonded substrate and flexible circuit structure is then heated while applying pressure to cure the adhesive layer and firmly affix the substrate structure to the back surface of the flexible circuit.

The heat and pressure step utilizes an aluminum plate having a relatively malleable rubber shoe secured to the bottom surface of the aluminum plate. The heat and pressure step provides a downward force on the aluminum plate while applying heat to the substrate in order to affix the flexible tape to the top surface of the barrier layer. The rubber shoe extends over the edges of the substrate, and the downward force causes the tape to bend where not supported by the barrier layer or substrate. Due to the bending of the tape, the resulting TAB head assembly has nozzles which are skewed with respect to the substrate causing ink trajectory errors. Thus, when the TAB head assembly is scanned across a recording medium, the TAB head assembly trajectory errors will affect the location of printed dots and thus affect the quality of printing.

Nozzle skewing is caused by lamination pressure and the semifluid properties of the polymeric barrier material at temperatures higher than its glass transition temperature when heated. Delamination of the nozzle member from the barrier layer is caused by the post-bonding stress in the barrier layer. During the lamination process, the barrier material between the adjacent vaporization chambers is under pressure and is compressed erratically, which causes sloping of the nozzle member surface. A subsequent baking process releases stress in the barrier created by the bonding process, increasing nozzle skewing, and causes delamination. In a combined effect, skewing may also be caused by the evaporation of some volatile components in the barrier material and hence the barrier material and hence the barrier shrinkage at the exposed boundaries in the prolonged baking process. Delamination both at THA level and pen level are caused by the weak adhesive interface between the substrate and the flexible tape.

In addition, the barrier material and adhesion degrades with the aggressive solvents in newer ink formulations. Moreover, all workable solutions developed for THA to print cartridge body detachment problems caused by the stresses involved in the THA to print cartridge body attachment process, resulted in increased delamination at the adhesive substrate/tape interface.

Accordingly, it would be advantageous to have an improved printhead design for facilitating the attachment of a nozzle member to the substrate which increases the substrate/tape interface bond strength and reduces deformation of the barrier material, ink trajectory errors, detachment and delamination.

This in turn would result in ease of assembly, higher yields, improved reliability, ease of surface serviceability, and overall material and manufacturing cost reductions.

SUMMARY OF THE INVENTION

The present invention provides a method of laser welding of two materials by a laser beam having a specified wavelength, comprising the steps of providing a first material with a seed metal pattern on a surface thereof and a second material with a corresponding mating seed metal pattern on a surface thereof, said seed metal having a suitable absorption at the wavelength of the laser beam; aligning the seed metal pattern on the surface of the first material and the corresponding mating seed metal pattern on the surface of a second material; holding the mating seed metal patterns in contact at a bond surface with an optical fiber; and laser welding the seed metal patterns by directing the laser beam through the optical fiber.

The present invention provides a method for the solderless laser welding of two materials by using a laser light beam attached to a fiber optic system which directs the light to a to create a seam weld. The phrases "through bulk material" and "through bulk substance", appearing in certain of the appended claims with regard to the path of the laser beam, are used to make plain that in the invention recited in those particular claims the beam is propagating through the material itself (of, e.g., a TAB tape or other component), not through a window therein. By using a fiber optic system the laser beam is optimally converted into thermal energy and weld flaws due to underheating or destruction of the materials due to overheating does not occur. The method and apparatus provide rapid, reproducible laser welding even for the smallest of contact geometries. For example, the method of the invention results in solderless gold-to-gold compression laser welding of a silicon substrate to the material contained in a polymer flex circuit tape, such as a polyimide, without damaging the tape. A strong solderless gold-to-gold bond can be formed between a gold bond line, or complex weld seam pattern on the flex circuit tape and a mating gold bond line or weld seam pattern on a semiconductor chip without any damage to the tape and prevents delamination and nozzle skewing associated with the adhesive curing process of other methods. The reduced nozzle skewing provides less dot placement error for print cartridges, and therefore better print quality.

The present invention provides an improved printhead design for facilitating the attachment of a nozzle member to the substrate, which increases nozzle area stiffness and nozzle camber angle and directionality, the substrate/tape interface bond strength and reduces deformation of the nozzle member, which provides higher consistent ink chamber refill speeds, and reduces ink trajectory errors and delamination. In addition, in particular embodiments the invention provides increased tolerance to aggressive solvents in inks and more consistent chamber geometry resulting in better control over drop volume. The invention improves the quality, repeatability and reliability of the pen and results in less process steps, thereby improving processing time, cost and reduced in-process handling.

The above in turn results ease of assembly, higher yields, improved reliability, ease of nozzle serviceability, and overall material and manufacturing cost reduction:

While the present invention will be described, for purposes of illustration only, in conjunction with the laser welding of a TAB circuit to the silicon substrate of an inkjet printhead, the present method and apparatus for the solderless laser welding of two contact materials by using a laser light beam attached to a fiber optic system is applicable to laser welding other materials to each other.

Other advantages will become apparent after reading the disclosure.

BRIEF DESCRIPTION OF THE DRAWINGS

The present invention can be further understood by reference to the following description and attached drawings which illustrate the preferred embodiment.

Other features and advantages will be apparent from the following detailed description of the preferred embodiment, taken in conjunction with the accompanying drawings, which illustrate, by way of example, the principles of the invention.

FIG. 5 is a perspective view of the back surface of the TAB head assembly of FIG. 4 with a silicon substrate mounted thereon and the conductive leads attached to the substrate.

FIG. 6 is a side elevational view in cross-section taken along line A—A in FIG. 5 illustrating one system (compare the above-mentioned application Ser. No. 08/558,567 for a more highly preferred system) for attachment of conductive leads to electrodes on the silicon substrate.

DETAILED DESCRIPTION OF THE PREFERRED EMBODIMENTS

While the present invention will be described, for purposes of illustration only, in conjunction with the laser welding of a TAB circuit to the silicon substrate of an inkjet printhead, the present method and apparatus for the solderless laser welding of two materials by using a laser light beam attached to a fiber optic system is applicable to laser welding of other types of electrical members to each other.

Figure 1:
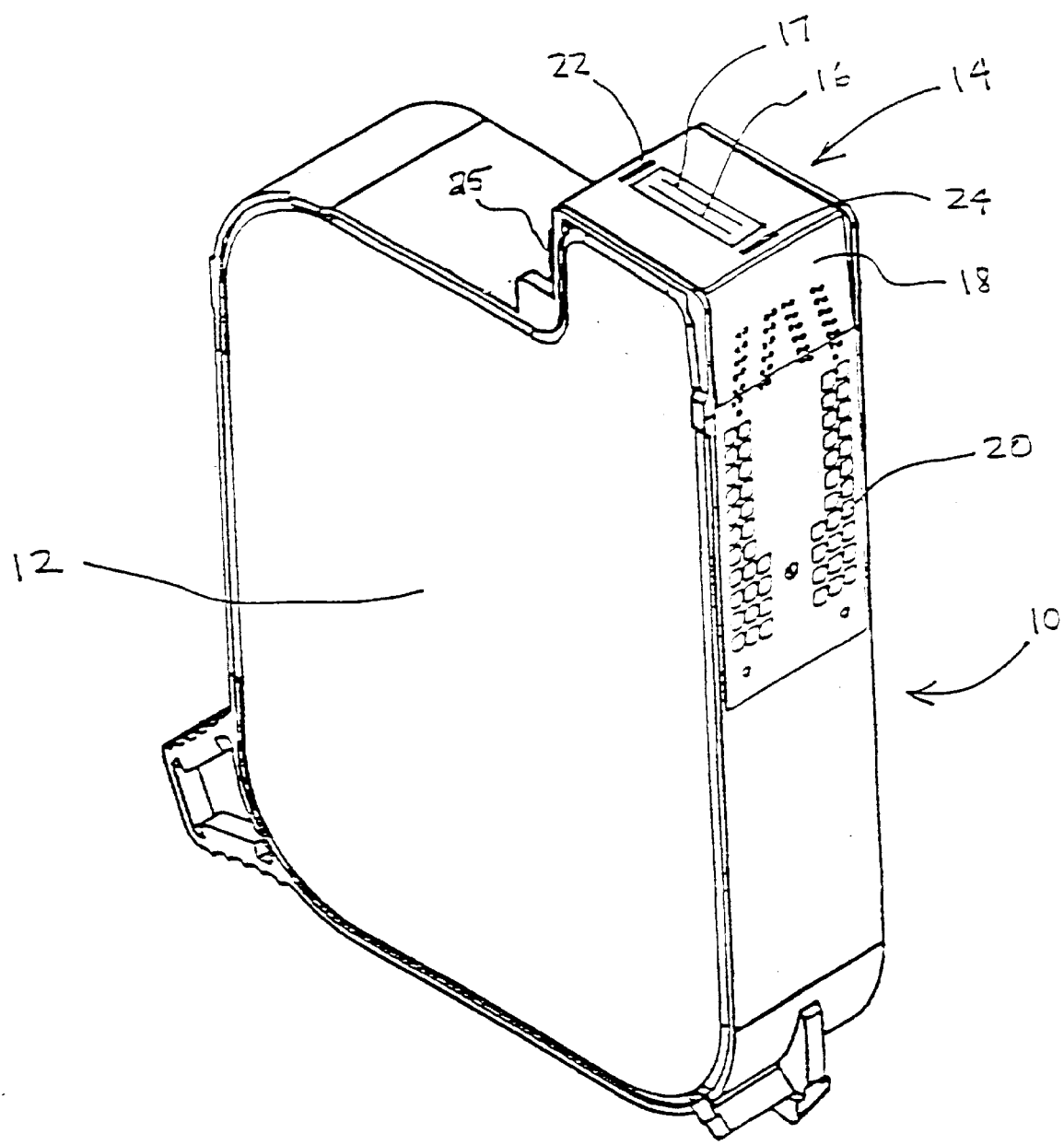
FIG. 1 is a perspective view of an inkjet print cartridge according to one embodiment of the present invention.

Referring to FIG. 1, reference numeral 10 generally indicates an inkjet print cartridge incorporating a printhead according to one embodiment of the present invention simplified for illustrative purposes. The inkjet print cartridge 10 includes an ink reservoir 12 and a printhead 14, where the printhead 14 is formed using Tape Automated Bonding (TAB). The printhead 14 (hereinafter "TAB head assembly 14") includes a nozzle member 16 comprising two parallel columns of offset holes or orifices 17 formed in a flexible polymer flexible circuit 18 by, for example, laser ablation.

A back surface of the flexible circuit 18 includes conductive traces 36 formed thereon using a conventional photolithographic etching and/or plating process. These conductive traces 36 are terminated by large contact pads 20 designed to interconnect with a printer. The print cartridge 10 is designed to be installed in a printer so that the contact pads 20, on the front surface of the flexible circuit 18, contact printer electrodes providing externally generated energization signals to the printhead. Bonding areas 22 and 24 in the flexible circuit 18 are where the bonding of the conductive traces 36 to electrodes on a silicon substrate containing heater resistors occurs.

In the print cartridge 10 of FIG. 1, the flexible circuit 18 is bent over the back edge of the print cartridge "snout" and extends approximately one half the length of the back wall 25 of the snout. This flap portion of the flexible circuit 18 is needed for the routing of conductive traces 36 which are connected to the substrate electrodes, most particularly those which are connected through the far end window 22. The contact pads 20 are located on the flexible circuit 18 which is secured to this wall and the conductive traces 36 are routed over the bend and are connected to the substrate electrodes through the windows 22, 24 in the flexible circuit 18.

Figure 2A:
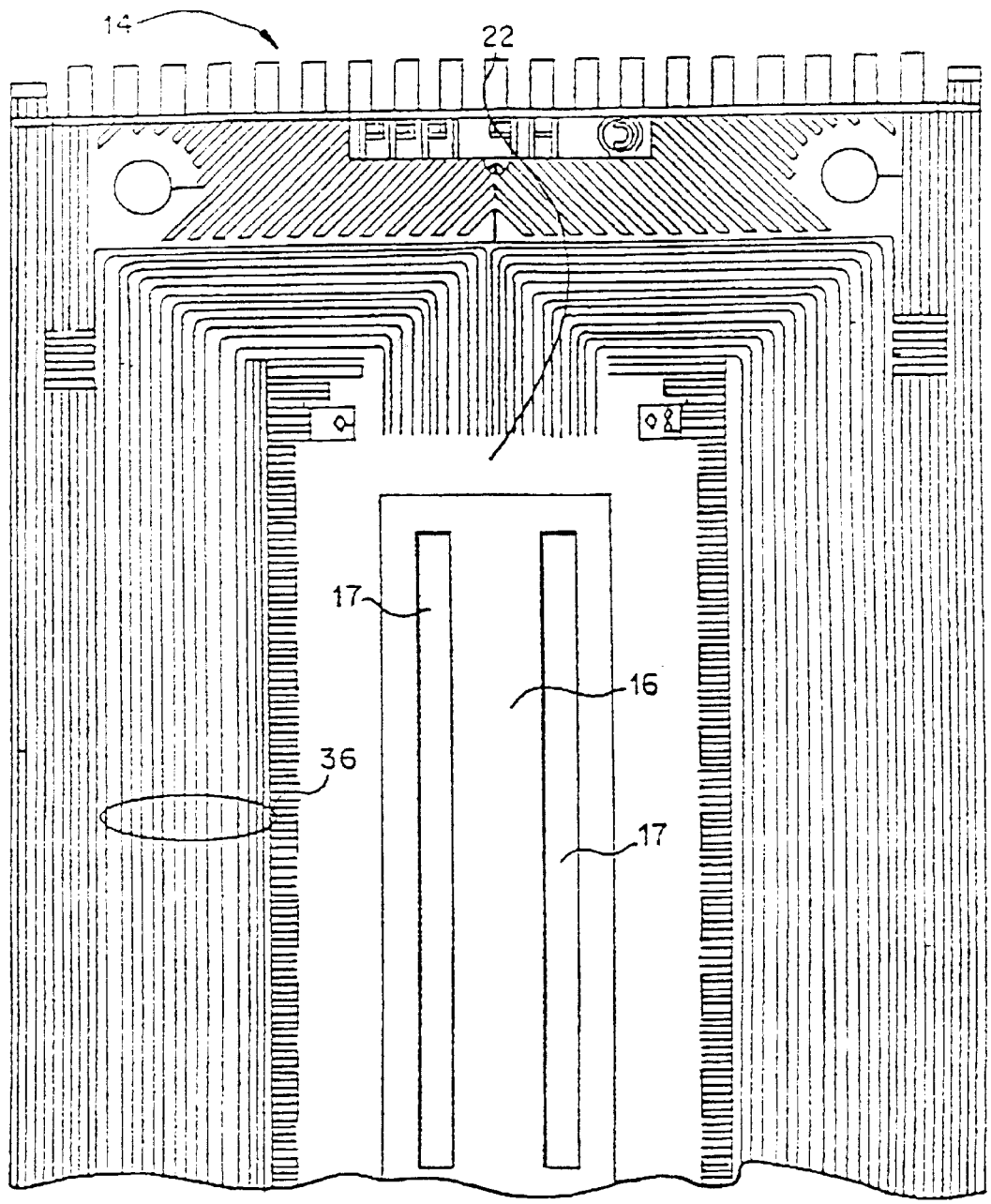
FIG. 2 is a Facial (unfolded flat) view of the front surface of the Tape Automated Bonding (TAB) printhead assembly ("THA") removed from the print cartridge of FIG. 1.
Figure 2B:
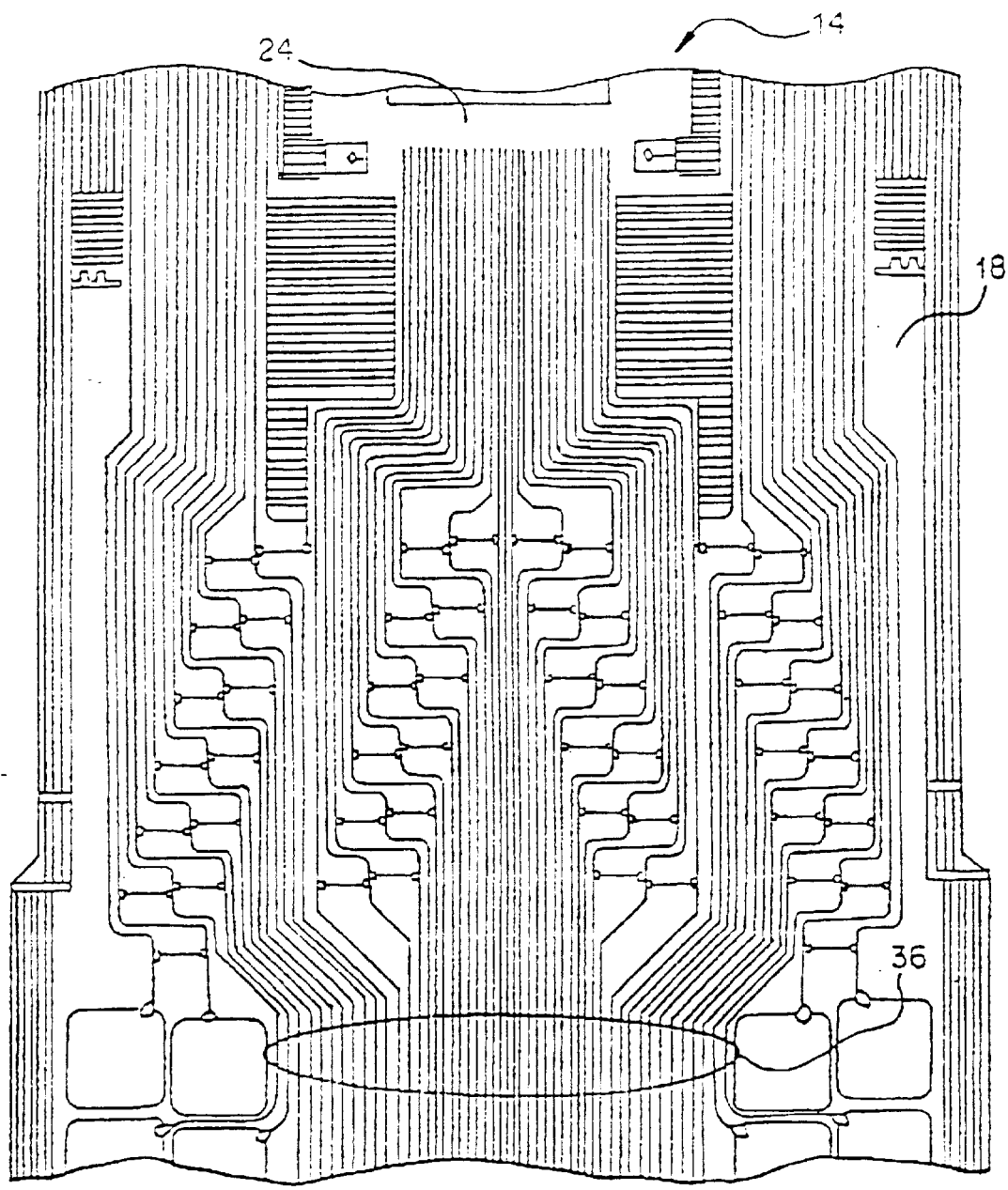
Figure 2C:
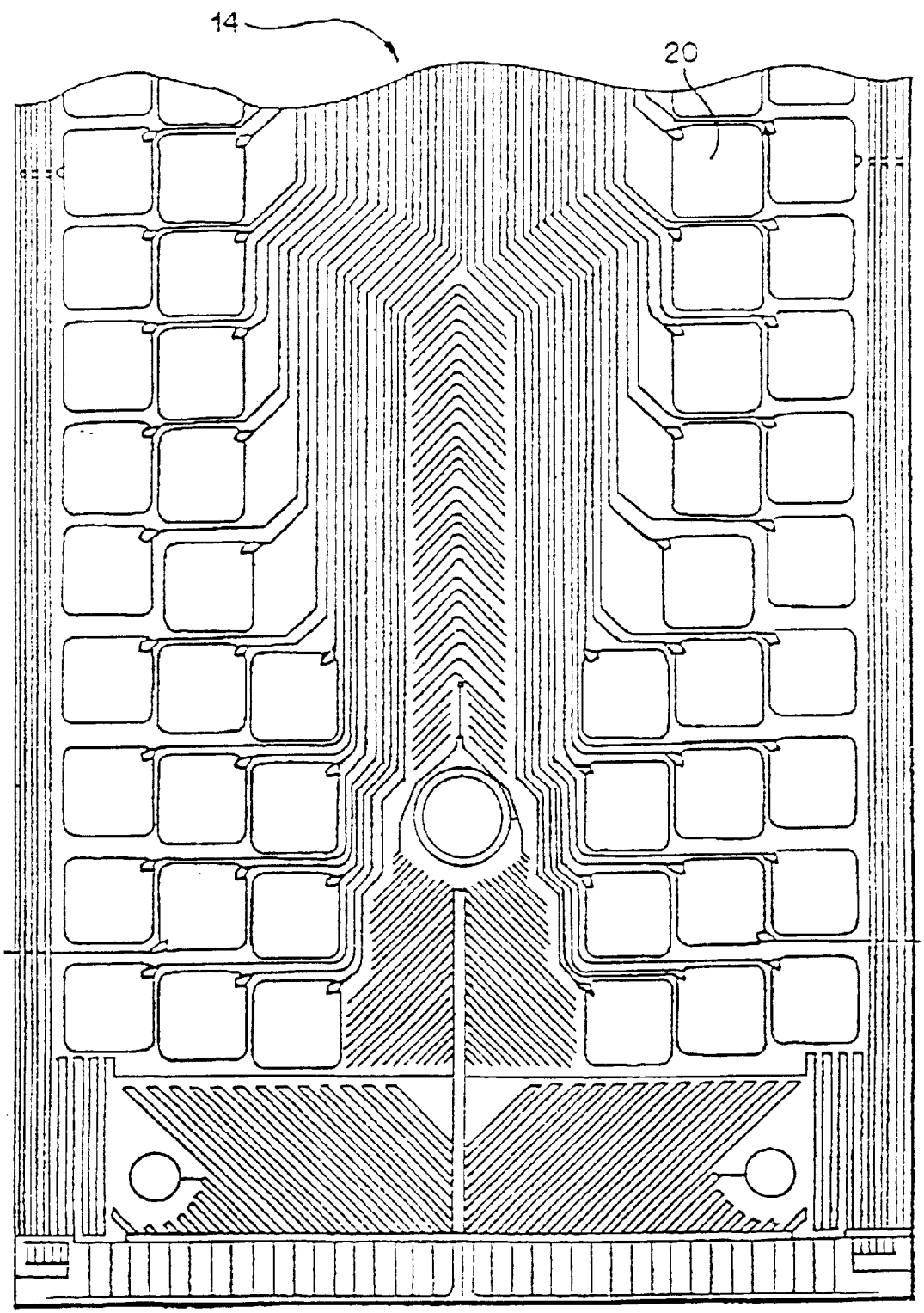

FIG. 2 shows a face view of the TAB head assembly 14 of FIG. 1 while still Flat-and before attachment to the print cartridge 10 and prior to windows 22 and 24 in the TAB head assembly 14 being filled with an encapsulant. (In the most highly preferred configuration, these windows 22, 24 are omitted as set forth in the above-mentioned application Ser. No. 08/558,567.) TAB head assembly 14 has affixed to the back of the flexible circuit 18 a silicon substrate 28 (not shown) containing a plurality of individually energizable thin film resistors. Each resistor is located generally behind a single orifice 17 and acts as an ohmic heater when selectively energized by one or more pulses applied sequentially or simultaneously to one or more of the contact pads 20.

The orifices 17 and conductive traces 36 may be of any size, test, and pattern, and the various figures are designed to simply and clearly show the features of the invention. The relative dimensions of the various features have been greatly adjusted for the sake of clarity.

Figure 14:
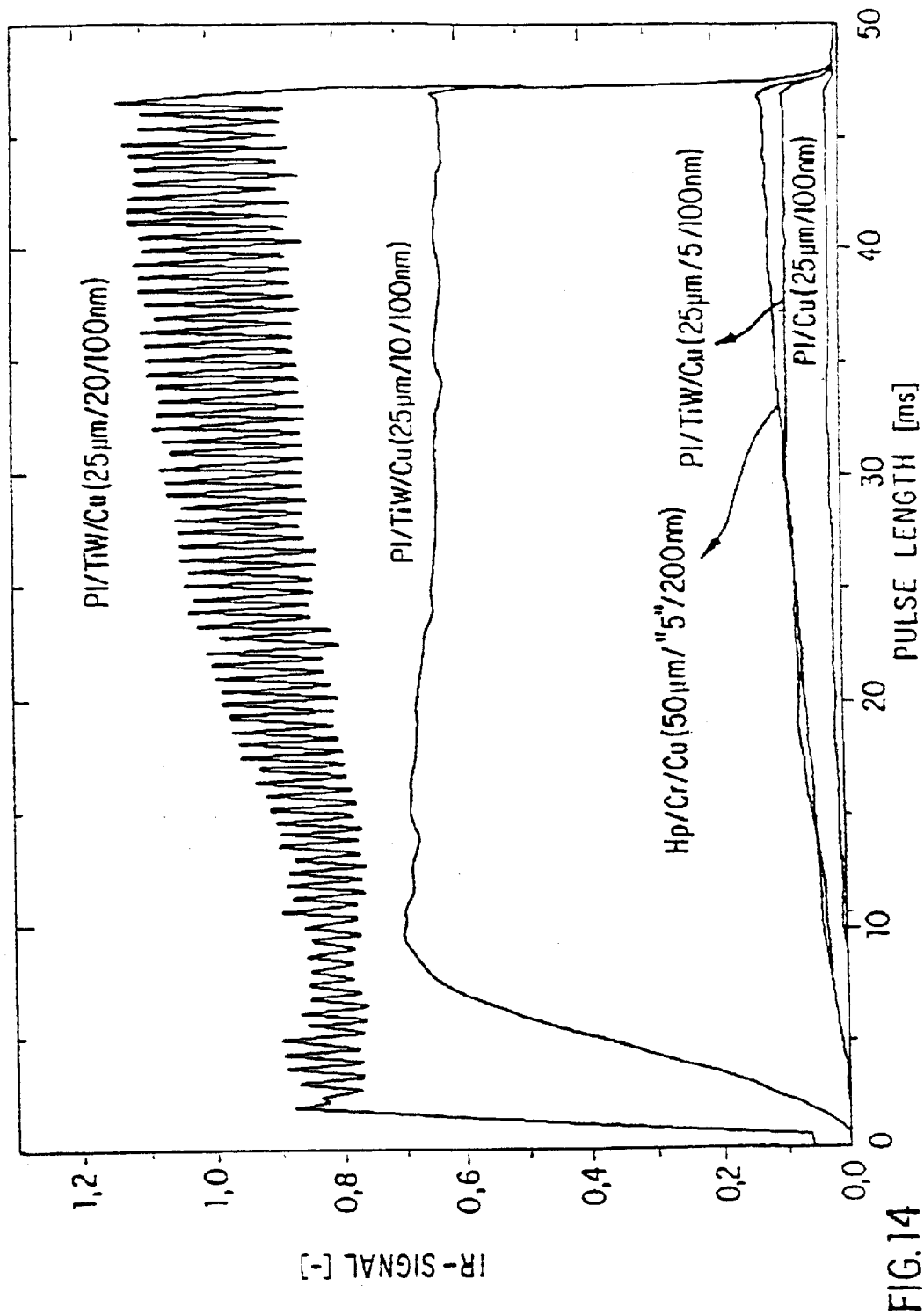
FIG. 14 illustrates the temperature rise in flex circuits with Ti/W seed layers.

The orifice 17 pattern on the flexible circuit 18 shown in FIG. 2 may be formed by a masking process in combination with a laser or other etching means in a step-and-repeat process, which would be readily understood by one of ordinary skill in the art after reading this disclosure. FIG. 14, to be described in detail later, provides additional details of this process. Further details regarding TAB head assembly 14 and flexible circuit 18 are provided below.

Figure 3:
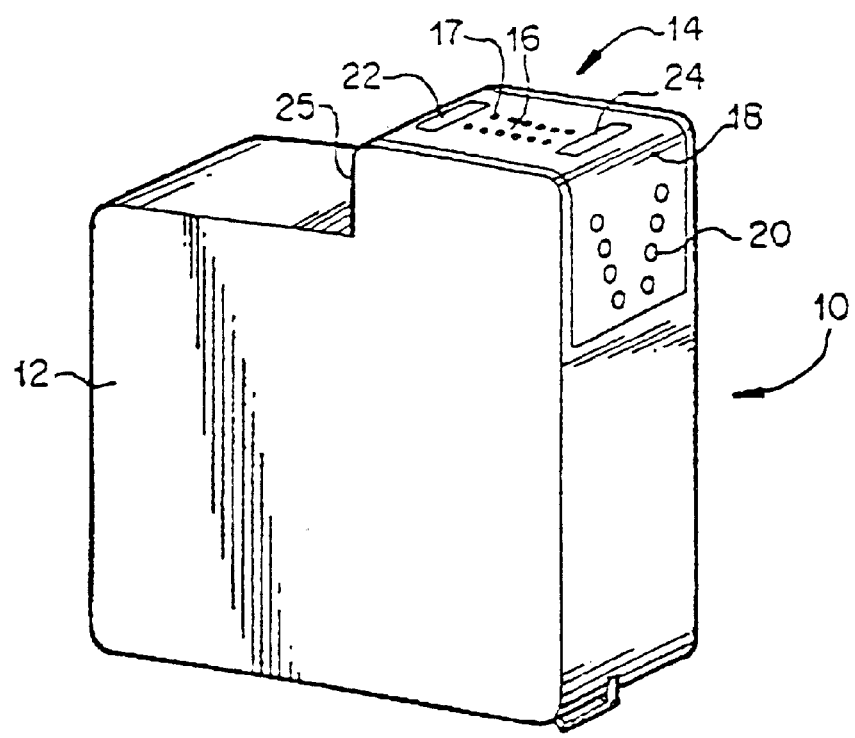
FIG. 3 is a perspective view of a simplified, schematic form of the inkjet print cartridge of FIG. 1. for illustrative purposes.
Figure 4:
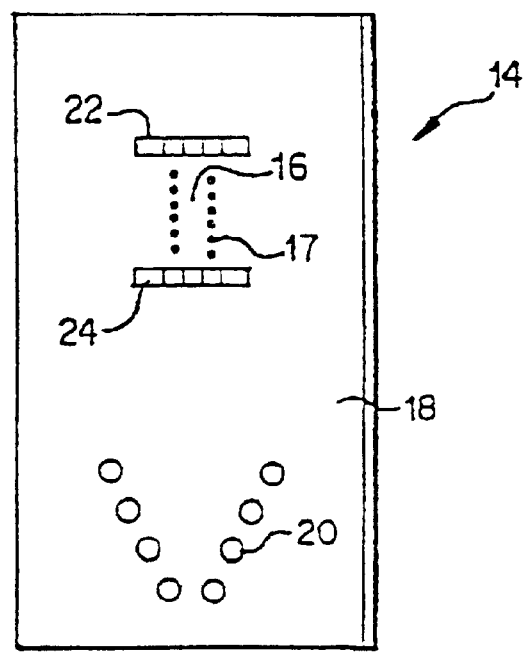
FIG. 4 is a Facial (unfolded flat) view of the front surface of the Tape Automated Bonding (TAB) printhead assembly (hereinafter "TAB head assembly") removed from the print cartridge of FIG. 3.

FIG. 3 is a perspective view of a schematic form of the inkjet print cartridge of FIG. 1, simplified for illustrative purposes. FIG. 4 is a view of the front surface of the Tape Automated Bonding (TAB) printhead assembly (hereinafter "TAB head assembly")shown Flat and before attachment to the simpli print cartridge of FIG. 3.

Figure 7:
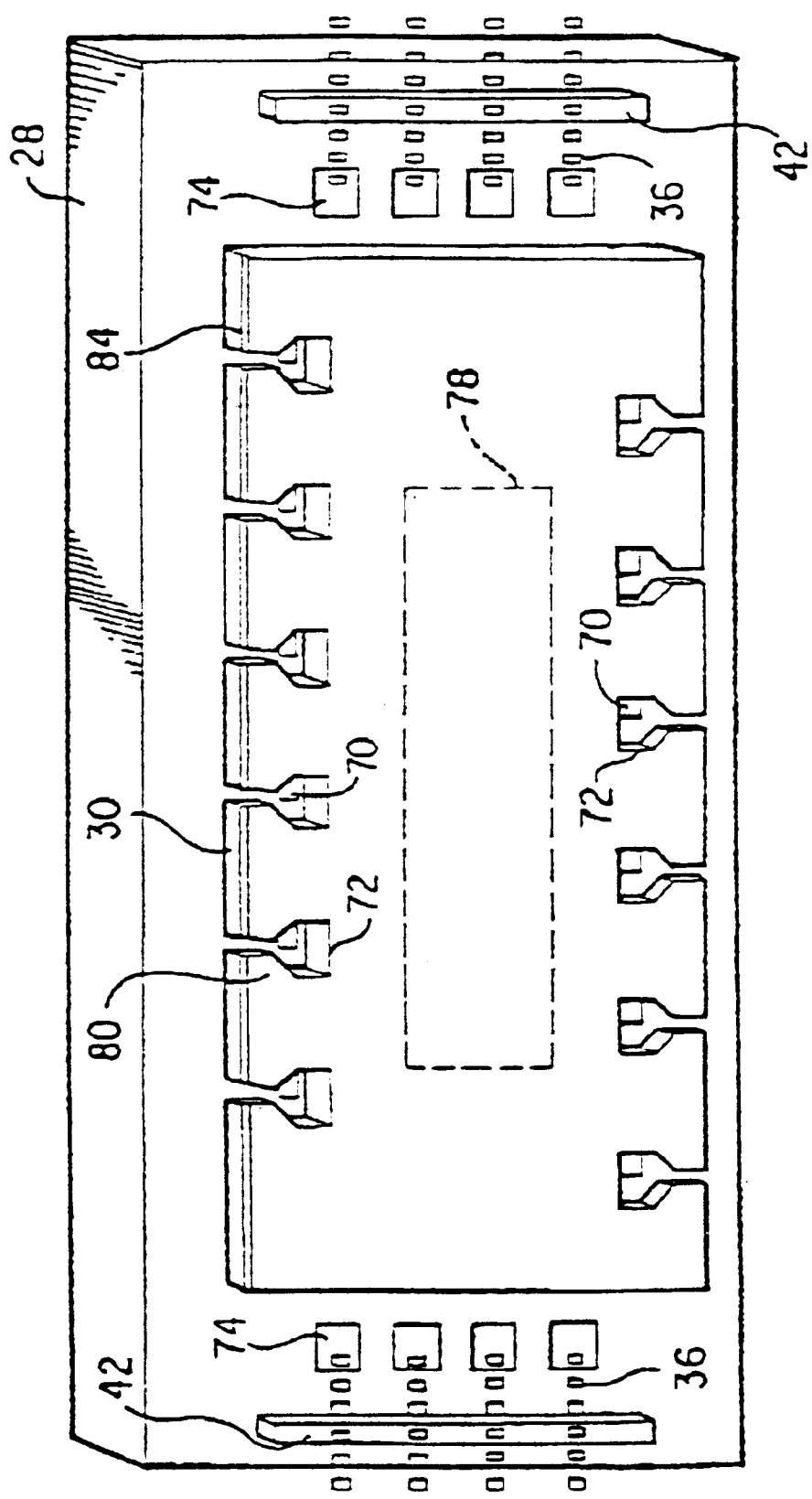
FIG. 7 is a top perspective view of a substrate structure containing heater resistors, ink channels, and vaporization chambers, which is mounted on the back of the TAB head assembly of FIG. 4.

FIG. 5 shows the back surface of the TAB head assembly 14 of FIG. 4 showing the silicon die or substrate 28 mounted to the back of the flexible circuit 18 and also showing one edge of the barrier layer 30 formed on the substrate 28 containing ink channels and vaporization chambers. FIG. 7 shows greater detail of this barrier layer 30 and will be discussed later. Shown along the edge of the barrier layer 30 are the entrances to the ink channels 32 which receive ink from the ink reservoir 12. The conductive traces 36 formed on the back of the flexible circuit 18 terminate in contact pads 20 ( shown in FIG. 4) on the opposite side of the flexible circuit 18 at location 38. The bonding areas 22 and 24 locate where the conductive traces 36 and the substrate electrodes 40 (shown in FIG. 6) are bonded by using a laser light beam attached to a fiber optic system which directs the light to the location to be bonded in accordance with the present invention.

FIG. 6 shows a side view cross-section taken along line A—A in FIG. 5 illustrating the connection of the ends of the conductive traces 36 to the electrodes 40 formed on the substrate 28. As seen in FIG. 6, a portion 42 of the barrier layer 30 is used to insulate the ends of the conductive traces 36 from the substrate 28. Also shown in FIG. 6 is a side view of the flexible circuit 18, the barrier layer 30, the bonding areas 22 and 24, and the entrances of the various ink channels 32. Droplets of ink 46 are shown being ejected from orifice holes associated with each of the ink channels 32.

FIG. 7 is a front perspective view of the silicon substrate 28 which is affixed to the back of the flexible circuit 18 in FIG. 5 to form the TAB head assembly 14. Silicon substrate 28 has formed on it, using conventional photolithographic techniques, two rows or columns of thin film resistors 70, shown in FIG. 7 exposed through the vaporization chambers 72 formed in the barrier layer 30.

In one embodiment, the substrate 28 is approximately one-half inch long and contains 300 heater resistors 70, thus enabling a resolution of 600 dots per inch. Heater resistors 70 may instead be any other type of ink ejection element, such as a piezoelectric pump-type element or any other conventional element. Thus, element 70 in all the various figures may be considered to be piezoelectric elements in an alternative embodiment without invalidating the herein-relevant general principles of hydrodynamic operation of the printhead. Also formed on the substrate 28 are electrodes 74 for connection to the conductive traces 36 (shown by dashed lines) formed on the back of the flexible circuit 18.

A demultiplexer 78, shown by a dashed outline in FIG. 7, is also formed on the substrate 28 for demultiplexing the incoming multiplexed signals applied to the electrodes 74 and distributing the signals to the various thin film resistors 70. The demultiplexer 78 enables the use of many fewer electrodes 74 than thin film resistors 70. Having fewer electrodes allows all connections to the substrate to be made from the short end portions of the substrate, so that these connections will not interfere with the ink flow around the long sides of the substrate. The demultiplexer 78 may be any decoder for decoding encoded signals applied to the electrodes 74. The demultiplexer has input leads (not shown for simplicity) connected to the electrodes 74 and has output leads (not shown) connected to the various resistors 70. The demultiplexer 78 circuitry is discussed in further detail below.

Also formed on the surface of the substrate 28 using conventional photolithographic techniques is the barrier layer 30, which may be a layer of photoresist or some other polymer, in which is formed the vaporization chambers 72 and ink channels 80. A portion 42 of the barrier layer 30 insulates the conductive traces 36 from the underlying substrate 28, as previously discussed with respect to FIG. 4.

In order to affix the top surface of the barrier layer 30 to the back surface of the flexible circuit 18 shown in FIG. 5, the substrate structure is positioned with respect to the back surface of the flexible circuit 18 so as to align the resistors 70 with the orifices formed in the flexible circuit 18. This alignment step also inherently aligns the electrodes 74 with the ends of the conductive traces 36. The top surface of the barrier layer 30 is then bonded to the back surface of the flexible circuit 18. The traces 36 are then bonded to the electrodes 74. These alignment and bonding processes are described in more detail with respect to FIG. 8.

Figure 8:
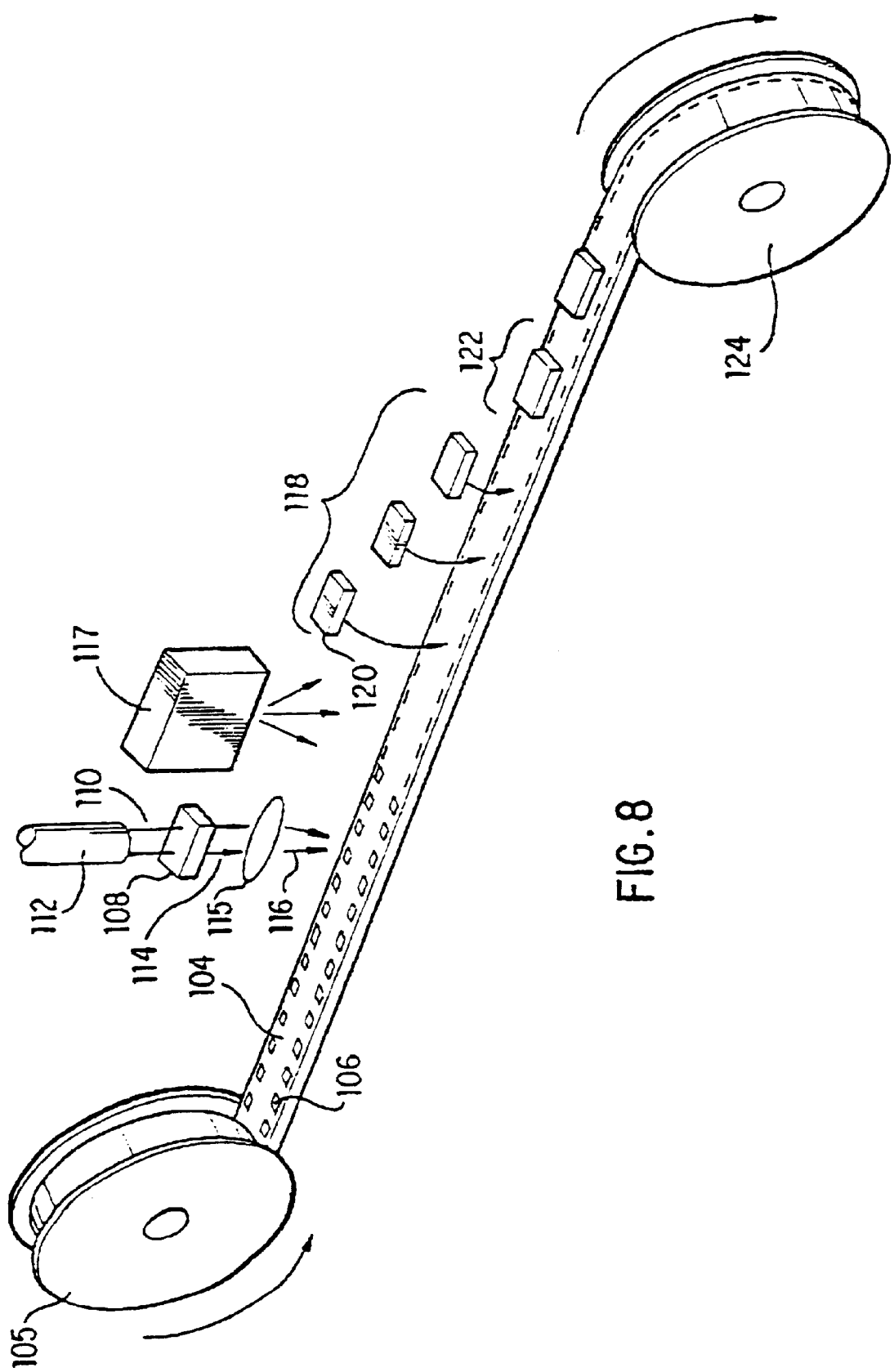
FIG. 8 illustrates one process which may be used to form the preferred TAB head assembly.

FIG. 8 illustrates one method for forming the TAB head assembly 14. The starting material is a Kapton® or Upilex® type polymer tape 104, although the tape 104 can be any suitable polymer film which is acceptable for use in the below-described procedure. Some such films may comprise teflon, polyamide or polyinide, polymethylmethacrylate, polycarbonate, polyester, polyamide polyethylene-terephthalate or mixtures thereof.

The tape 104 is typically provided in long strips on a reel 105. Sprocket holes 106 along the sides of the tape 104 are used to accurately and securely transport the tape 104. Alternately, the sprocket holes 106 may be omitted and the tape may be transported with other types of fixtures.

In the preferred embodiment, the tape 104 is already provided with conductive copper traces 36, such as shown in FIGS. 2, 4 and 5, formed thereon using conventional metal deposition and photolithographic processes. The particular pattern of conductive traces depends on the manner in which it is desired to distribute electrical signals to the electrodes formed on silicon dies, which are subsequently mounted on the tape 104.

In the preferred process, the tape 104 is transported to a laser processing chamber and laser-ablated in a pattern defined by one or more masks 108 using laser radiation 110, such as that generated by an Excimer laser 112. The masked laser radiation is designated by arrows 114.

In a preferred embodiment, such masks 108 define all of the ablated features for an extended area of the tape 104, for example encompassing multiple orifices in the case of an orifice pattern mask 108, and multiple vaporization chambers in the case of a vaporization chamber pattern mask 108.

The laser system for this process generally includes beam delivery optics, alignment optics, a high precision and high speed mask shuttle system, and a processing chamber including a mechanism for handling and positioning the tape 104. In the preferred embodiment, the laser system uses a projection mask configuration wherein a precision lens 115 interposed between the mask 108 and the tape 104 projects the Excimer laser light onto the tape 104 in the image of the pattern defined on the mask 108. The masked laser radiation exiting from lens 115 is represented by arrows 116. Such a projection mask configuration is advantageous for high precision orifice dimensions, because the mask can be physically remote from the nozzle member. After the step of laser-ablation, the polymer tape 104 is stepped, and the process is repeated.

A next step in the process is a cleaning step wherein the laser ablated portion of the tape 104 is positioned under a cleaning station 117. At the cleaning station 117, debris from the laser ablation is removed according to standard industry practice.

The tape 104 is then stepped to the next station, which is an optical alignment station 118 incorporated in a conventional automatic TAB bonder, such as an inner lead bonder commercially available from Shinkawa Corporation, Model No. ILT-75. The bonder is preprogrammed to recognize an alignment (target) pattern on the nozzle member, create in the same manner and/or step as used to created the orifices, and a target pattern on the substrate, created in the same manner and/or step used to create the resistors. In the preferred embodiment, the nozzle member material is semi-transparent so that the target pattern on the substrate may be viewed through the nozzle member. The bonder then automatically positions the silicon dies 120 with respect to the nozzle members so as to align the two target patterns. Such an alignment feature exists in the Shinkawa TAB bonder. This automatic alignment of the nozzle member target pattern with the substrate target pattern not only precisely aligns the orifices with the resistors but also inherently aligns the electrodes on the dies 120 with the ends of the conductive traces formed in the tape 104, since the traces and the orifices are aligned in the tape 104, and the substrate electrodes and the heating resistors are aligned on the substrate. Therefore, all patterns on the tape 104 and on the silicon dies 120 will be aligned with respect to one another once the two target patterns are aligned.

Thus, the alignment of the silicon dies 120 with respect to the tape 104 is performed automatically using only commercially available equipment. By integrating the conductive traces with the nozzle member, such an alignment feature is possible. Such integration not only reduces the assembly cost of the printhead but reduces the printhead material cost as well.

The automatic TAB bonder then uses a gang bonding method to bond the conductive traces down onto the associated substrate electrodes as described in U.S. patent application Ser. No. 08/558,567, filed Oct. 31, 1995, entitled "Solderless Connection of Electrical Contacts Utilizing Combination Laser and Fiber Optic Push Connect System;" which is herein incorporated by reference.

The tape 104 is then stepped to station 122 to affix the top surface of the barrier layer 30 to the back surface of the flexible circuit 18. During this step higher bond temperatures are generally preferred to decrease the bond time, but higher bond temperatures will soften the flex circuit and cause more deformation of the Kapton tape. Thus, it is preferred to have higher temperature at the contact point and lower temperature at the Kapton tape layer. This optimum contact temperature profile may be achieved by utilizing a Fiber Push Connect (FPC) single point laser welding process. FPC in conjunction with a TAB circuit provides an ideal solution for a TAB head assembly for an inkjet printer printhead.

Figure 9:
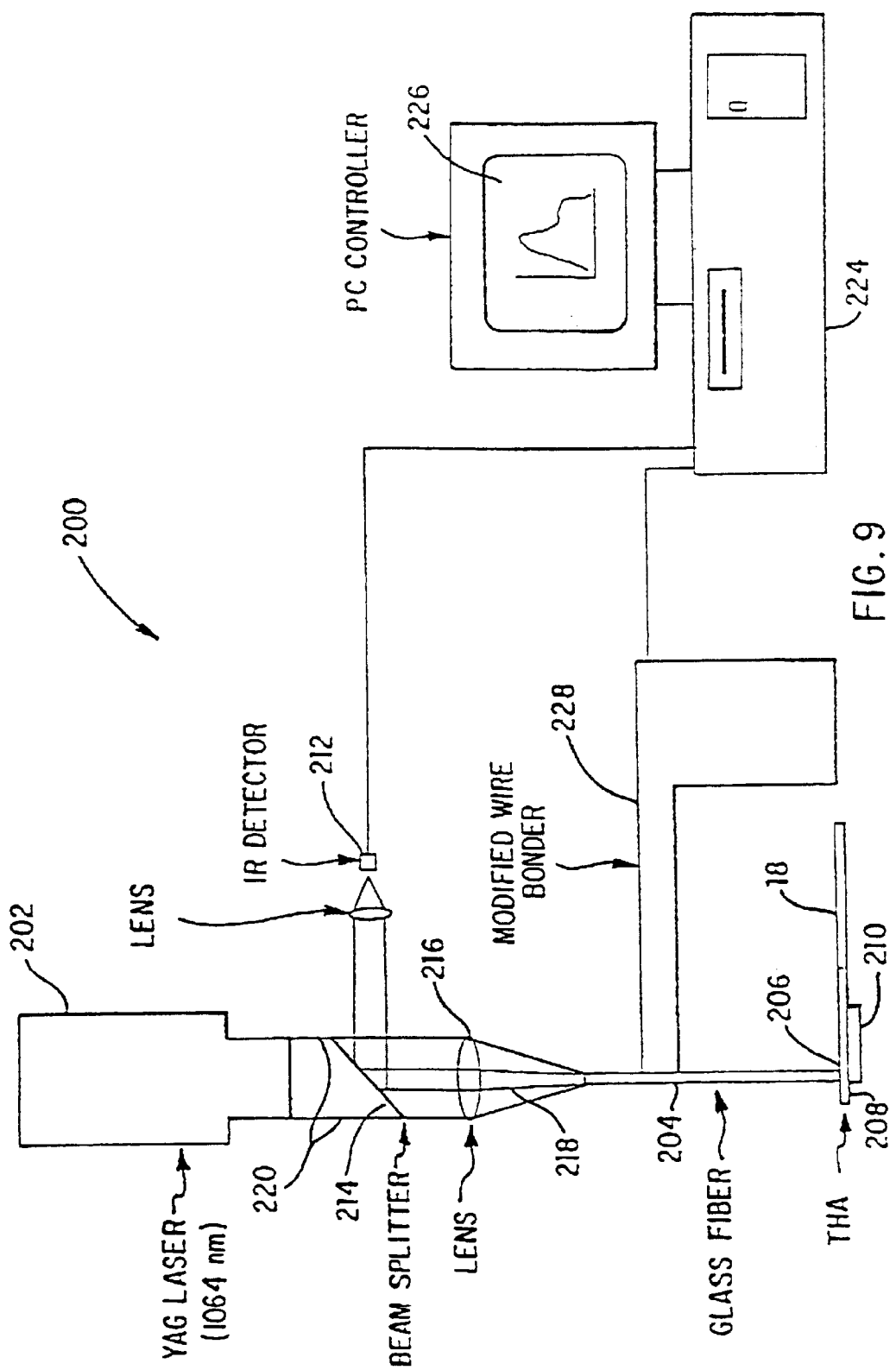
FIG. 9 is a schematic diagram for a fiber push connect laser system as used in the present invention.
Figure 10:
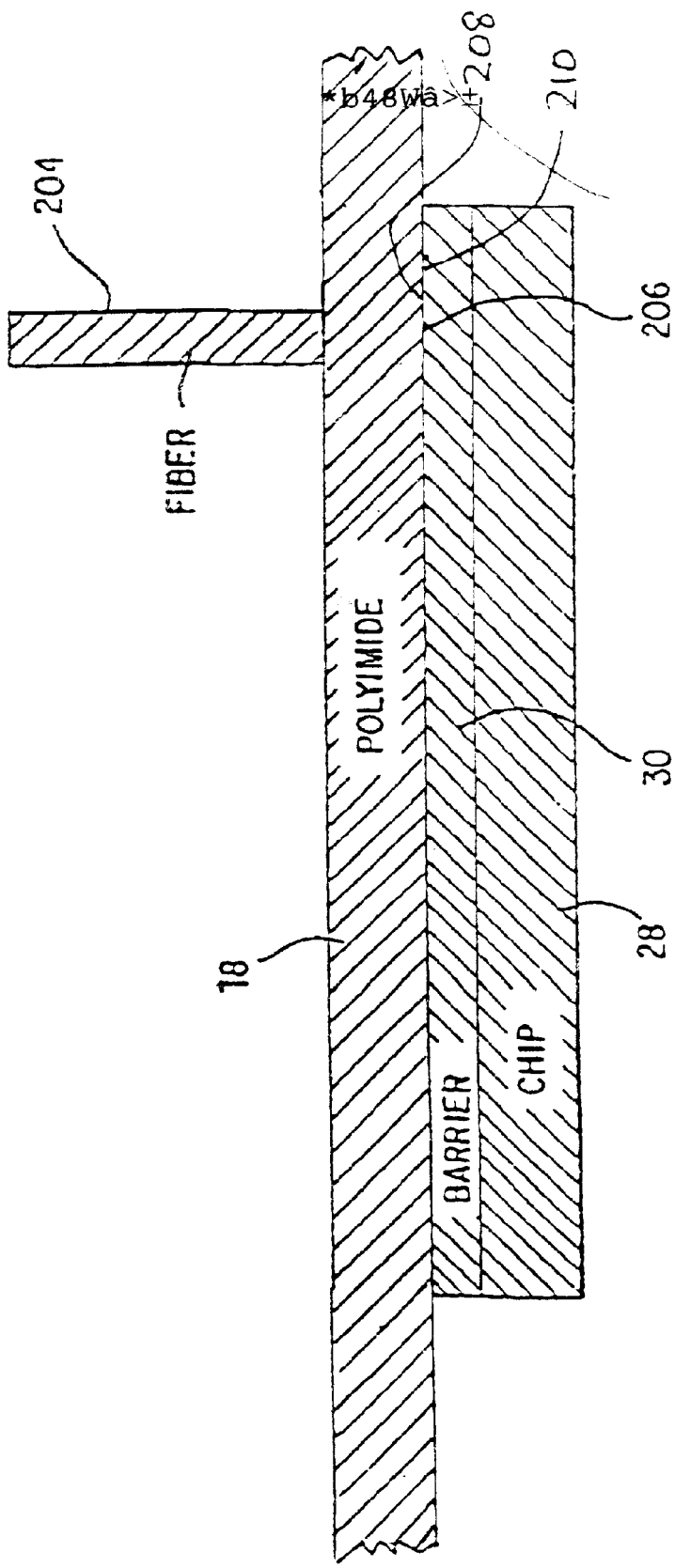
FIG. 10 shows in detail the flex circuit, a spot weld point, the TAB lead and die pad.

A schematic for a FPC laser system 200 is illustrated in FIG. 9. This system consists of an Nd YAG or Diode laser 202, equipped with a glass ($SiO_2$) optical fiber 204. The system guides the laser beam to the contact or attachment point 206 via the optical glass fiber 204. An optimum thermal coupling is achieved by pressing two parts together by means of the fiber 204 which creates a zero contact gap between the TAB gold bond line 208 and die gold bond line 210 and thus improved thermal efficiency. FIG. 10 shows in greater detail the flex circuit 18, the contact point 206, the TAB gold bond line 208 and die gold bond line 210.

Referring to FIG. 9, a feedback temperature loop is achieved by means of an infrared detector 212 through the glass fiber. The temperature or absorption behavior response of the IR-radiation reflected by the gold bond lines 208, 210 at the contact point 206 is gathered. The outgoing laser beam 220 from the laser source 202 goes through a half-transmission mirror or beam splitter 214 and through a focussing lens 216 into the glass fiber optic 204. The reflected light 218 from the fiber optic shown with dashed lines is reflected by the half mirror 21 and arrives via focussing lens 222 at an IR detector 212 that is connected to a PC Controller 224. The graph shown on the monitor 226 of PC controller 224 is meant to show that the PC Controller 224 can store definite expected plots for the temperature variation of the laser welding process with which the actual temperature variation can be compared. The PC Controller 224 is connected with the laser source 202 so that the laser parameters can be controlled if necessary.

The reproducibility of a FPC laser bond depends both on a high degree of thermal coupling between the gold bond lines 208, 210 and high absorption of the laser energy by gold bond lines 208, 210. To optimize the laser welding process, minimum absorption is desired in the Kapton tape and maximum absorption is desired in the gold bond lines 208, 210. Metals with higher absorption rate will transform a higher share of the laser energy into heat. This will result in a shorter attachment process which in turn will result in a higher quality bond.

Figure 12:
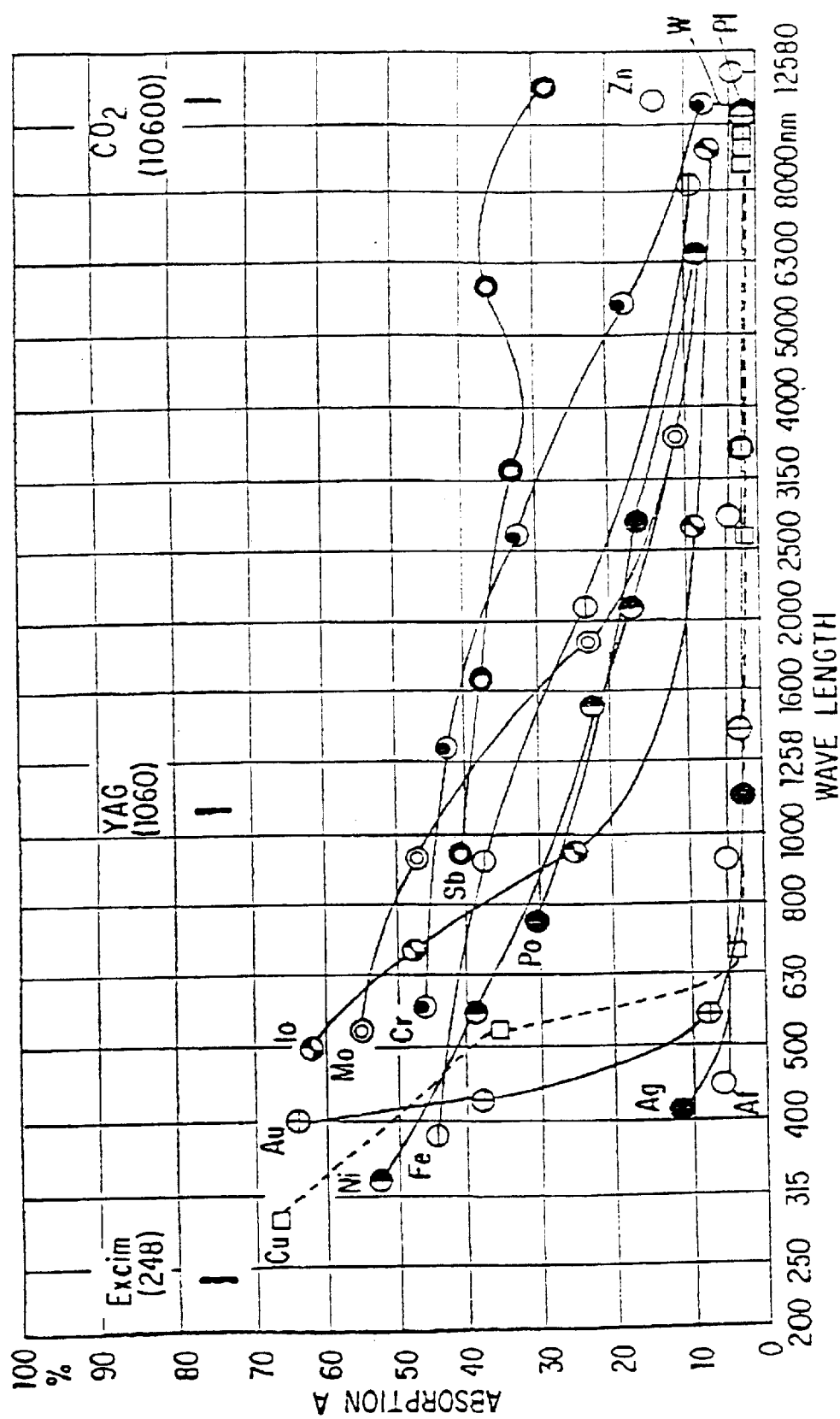
FIG. 12 shows the absorption property versus wavelength for various metals.

The laser utilized is a YAG laser with a wavelength of 1064 nm. FIG. 12 illustrates the absorption property versus wavelength for several metals. As can be observed from FIG. 12, chromium and molybdenum have the highest absorption characteristics at this wavelength. Chromium was selected as the base metal due to the fact that most flex circuit manufacturers are using chromium as the seed layer. The penetration depth of the laser into chromium is about 10 nm with a spot size of 5 nm; this requires a minimum chromium thickness of 15 nm. The laser beam creates a localized heated zone causing the metals (or solder material), to melt and create a bond between two joining surfaces without increasing the temperature of the Kapton tape. However, any gap between two mating metal parts will cause overheating of the metal surface exposed to the laser beam. This will cause deformation of the flexible circuit 18 with no bond between metal surfaces. Also, an increased temperature in the flex circuit 18 will cause damage to the flex circuit.

Figure 11:
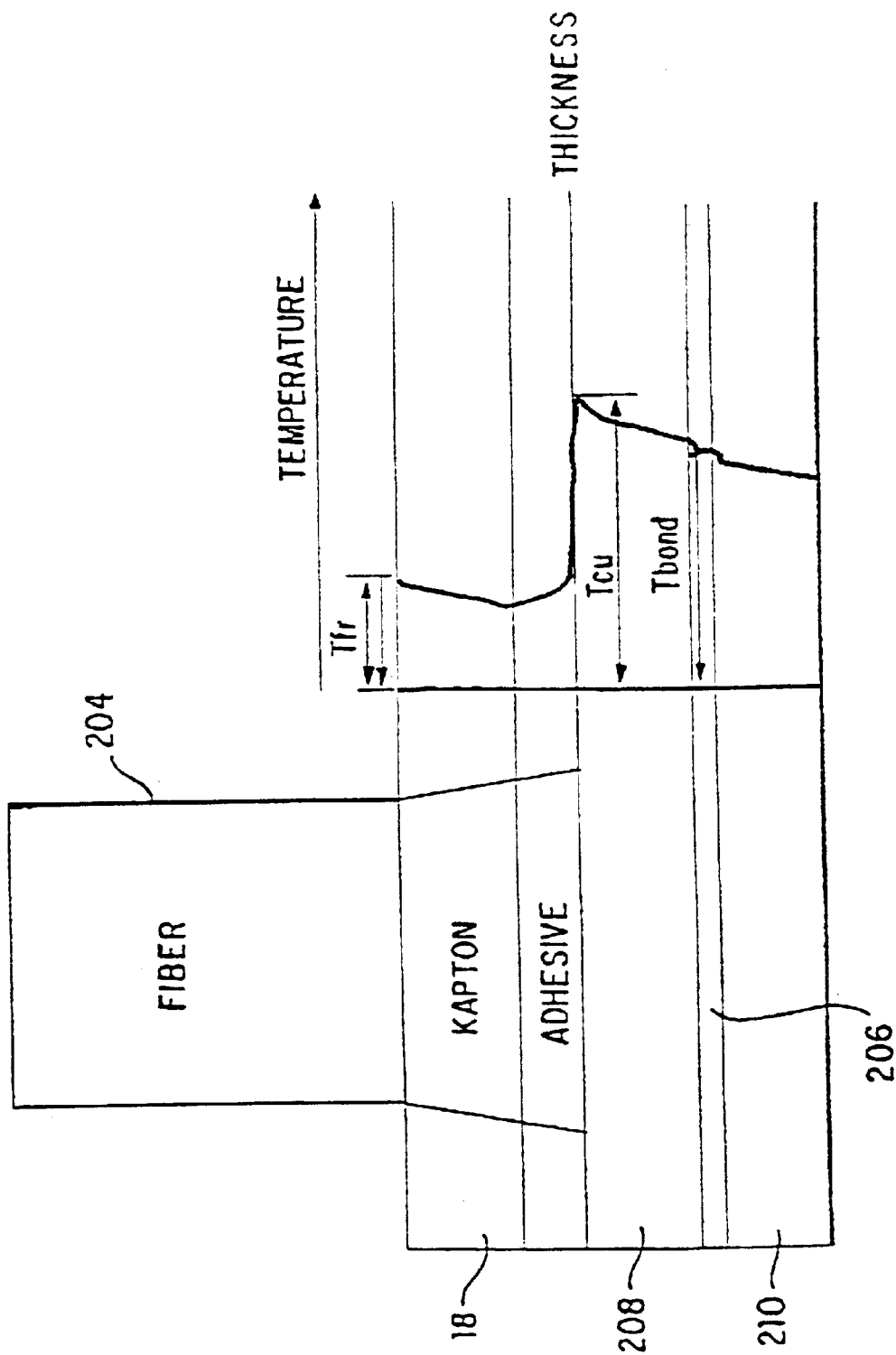
FIG. 11 shows the temperature profile of the flex circuit, weld beam and spot weld location during the laser welding process with the FPC laser.

FIG. 11 illustrates a typical temperature profile of the flex circuit 18 during laser welding process with the FPC laser. As it can be observed from FIG. 11, the temperature at the attachment area 206 is considerably higher than the Kapton tape 18 temperature. This is achieved due to the high degree of the transparency of the Kapton tape at different wavelengths.

The Kapton polyimide tape is transparent to the YAG laser beam and the laser beam passes through the 2 mil thick layer of polyimide with minimal absorption. Chromium is a conventional seed layer that is used extensively to provide an adhesion layer between the copper trace and Kapton polyimide in a two-layer flex circuit manufacturing process. A chromium layer with a minimum thickness of 10 nm (or 20 nm nominal) is required to provide a medium which absorbs the laser energy. The thickness of the chromium layer varies depending upon the flex circuit manufacturer, with reported thicknesses between 2 and 30 nm. A typical flex circuit manufacturing process utilizes a thin layer (20 nm) of sputtered chromium as a seed (adhesion) layer between the copper traces and Kapton polyimide.

Figure 13:
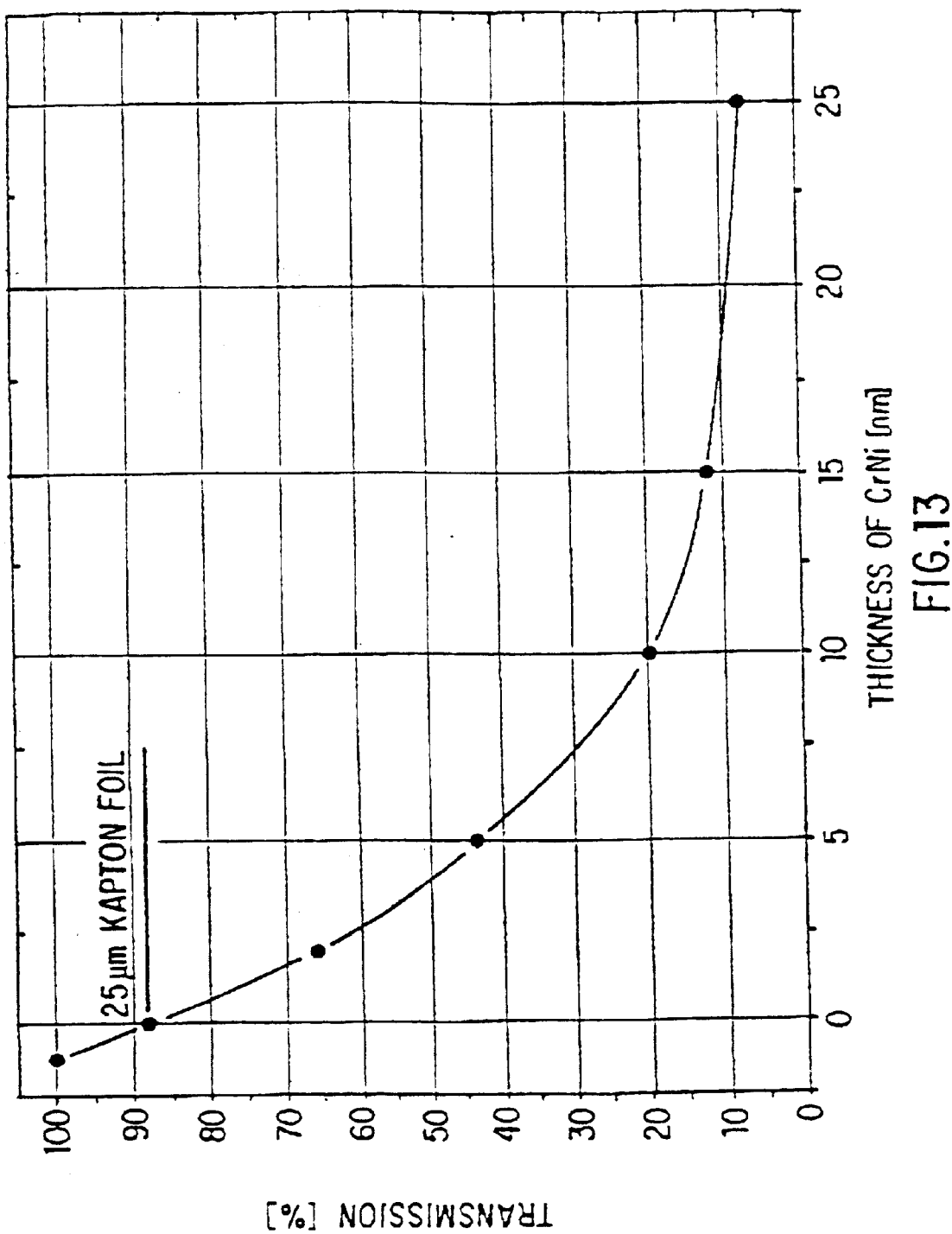
FIG. 13 illustrates the optical transmission results for five samples of Kapton® tape sputtered with 2, 5, 10, 15, and 25 nm of chromium.

Five samples of the Kapton tape were sputtered with 2, 5, 10 15, and 25 nm of chromium, and optical transmission was measured for these samples. FIG. 13 illustrates the optical transmission results for these samples. It can be seen that optical transmission initially drops rapidly with increased chromium thickness (from 65% for 2 nm of chromium, to 12% for 15 nm of chromium), but optical transmission changes very slowly when chromium thickness increases from 15 to 25 nm.

Figure 15:
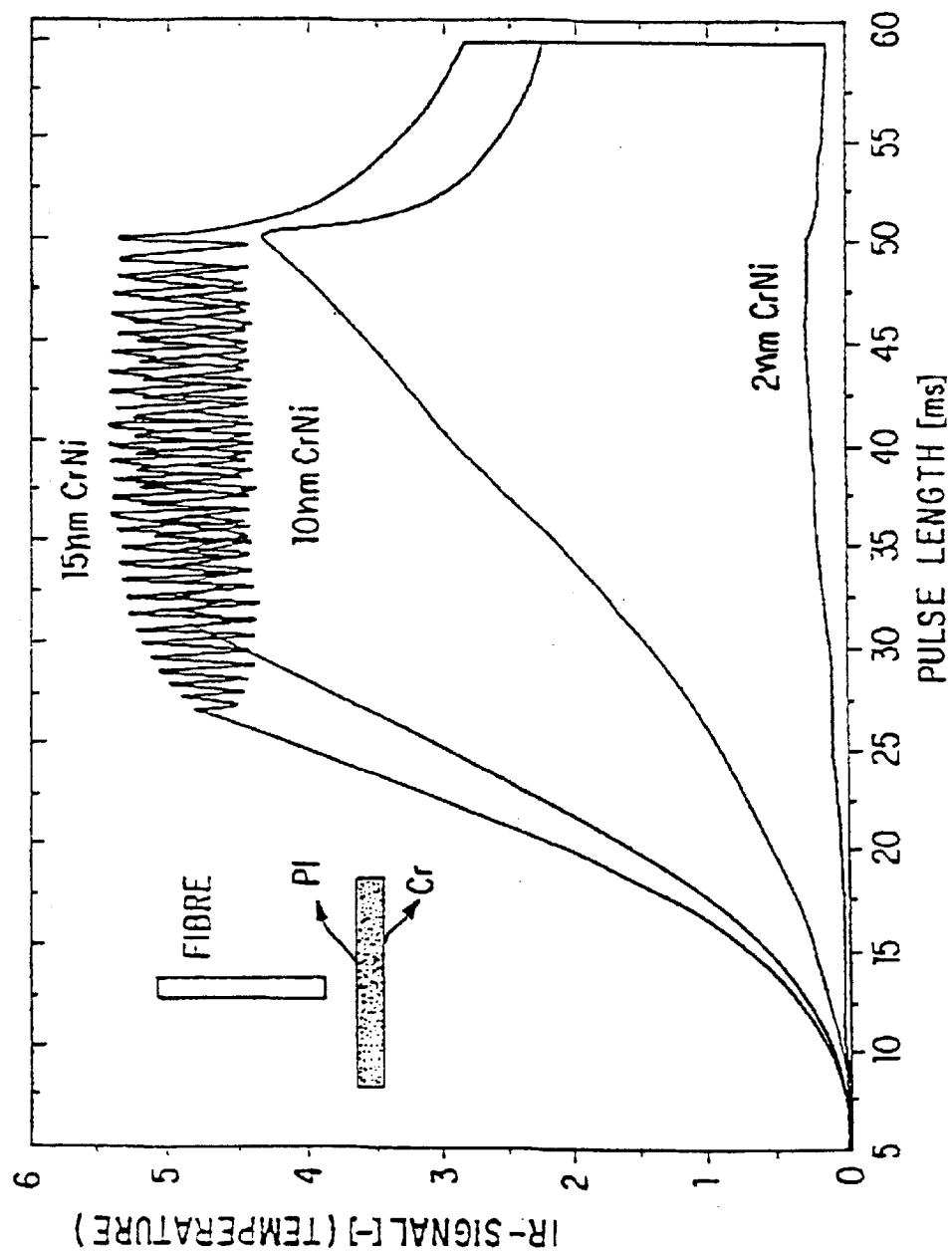
FIG. 15 illustrates the temperature rise in flex circuits with a chromium seed layer.

Laser welding process requires a fast temperature rise in the conductive trace to minimize the temperature rise in the Kapton and therefore minimize damage to the Kapton tape. FIGS. 14 and 15 illustrate temperature rise in several flex circuits with different constructions. FIG. 14 illustrates temperature rise in flex circuits with thicker seed layers. It is important to notice that flex circuits with 10 nm or less of Ti/W did not reach the temperature that is required for gold/gold laser welding, but the flex circuit with 20 nm of Ti/W did reach the laser welding temperature. Also, it should be noted that the rise time in the flex circuit with thicker Ti/W is faster, minimizing the potential of damage due to high localized temperatures in the Kapton tape.

The temperature (IR-Signal) fluctuation in the flex circuit with 20 nm of Ti/W is indicative of the fact that this flex circuit reached the maximum preset temperature required for gold/gold laser welding and then the laser feed-back loop temporarily dropped the laser energy so that increase in the TAB bond temperature did not damage the Kapton tape. As soon as the temperature of the Kapton tape dropped (by a preset amount), the laser energy automatically increased to full power to increase the TAB gold bond line temperature, and created a reliable gold/gold bond.

FIG. 15 illustrates similar results for different flex circuits with a chromium seed layer as opposed to Ti/W seed layer. It can be observed that flex circuit with 10 nm of chromium did reach the preset temperature required for gold/gold welding. Therefore, chromium seed layer has higher absorption characteristics compared to Ti/W seed layer for a YAG laser.

Figure 16:
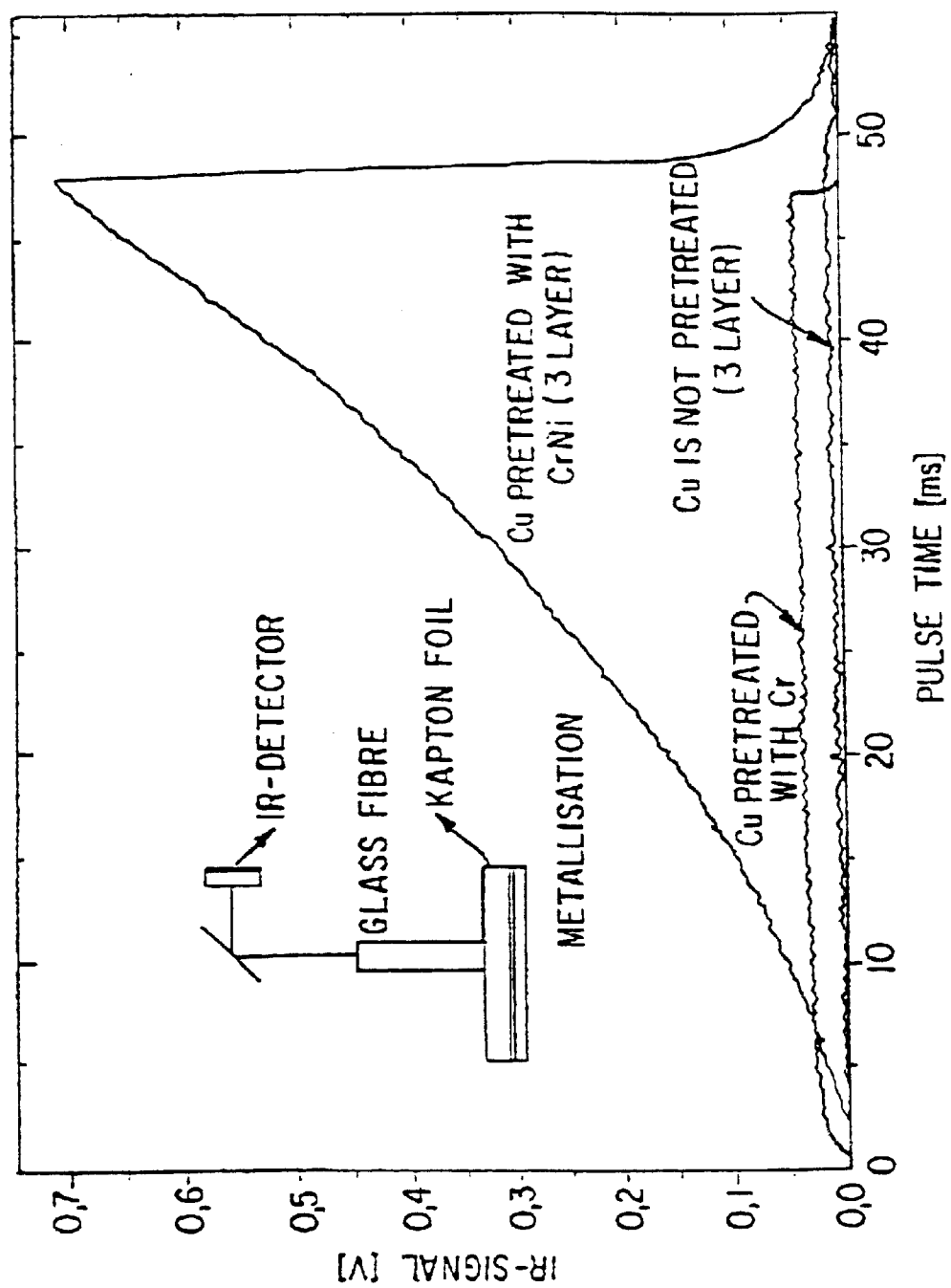
FIG. 16 illustrates temperature increase versus time in a 3-layer tape with different thickness chromium seed layers.

FIG. 16 illustrates temperature increase versus time in a 3-layer tape with a 20 nm chromium layer, a tape with a 5 nm chromium layer, and a tape with no chromium layer. As can be seen in FIG. 16, only the flex circuit with a 20 nm chromium layer indicated a rapid temperature rise.

Since it was established that chromium thickness is essential to the integrity of the gold/gold laser bond, when a YAG laser is used, an optimum chromium thickness was selected as a base line. Referring to FIG. 13, a chromium thickness over 15 nm does not decrease transmission importantly. Based on FIG. 15, a chromium thickness of 10 nanometers is the absolute minimum required thickness to provide a successful laser bond. FIG. 15 also illustrates that a flex circuit with 15 nm of chromium exhibit a much faster temperature rise in the copper trace, resulting in less or no damage to the Kapton tape. Therefore, 15 nm of chromium is optimum to provide a reliable and repeatable laser bond.

Some chromium diffusion into the copper is expected during the sputtering of chromium as a seed layer and plating processes during manufacture of the flex circuits. Diffusion of the chromium into the copper is a time and temperature dependent process, and it is difficult to determine the amount of chromium that will be diffused into the copper during these processes. Normally, it is estimated that a maximum amount of diffused chromium is under 5 nm. Based on these factors, a minimum chromium thickness after the sputtering process was established as 20 nm. This thickness should guarantee a minimum chromium thickness of 15 nm after the completed manufacture of the flex circuit.

FIGS. 17 to 22 show various embodiments of the present invention. In each of FIGS. 17–22, (A) shows the barrier structure, including ink vaporization chambers 72 and chamber walls 71, 73, and resistors 70; (B) shows a cross-section taken along line B—B of (A); and (C) shows the weld seam pattern for the embodiment.

Figure 17:
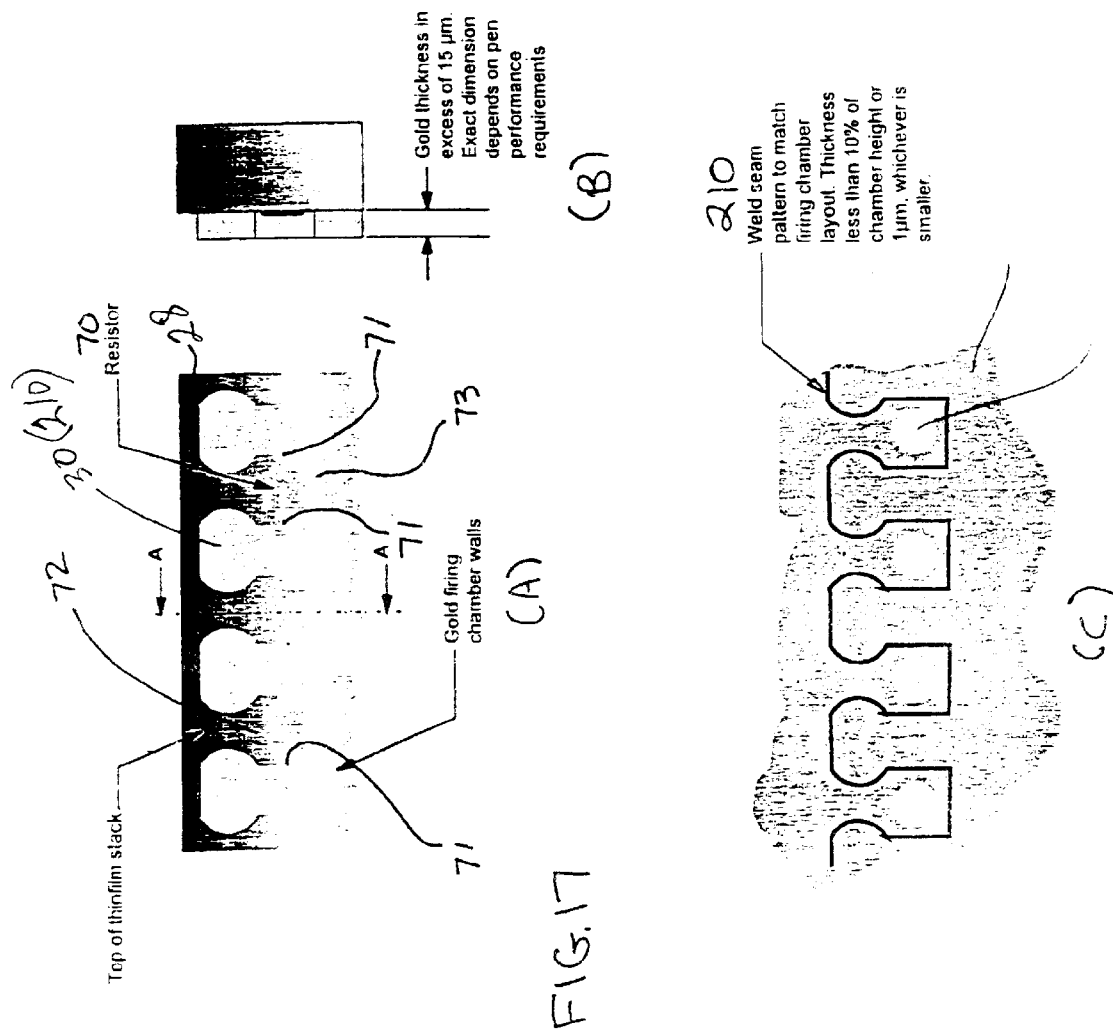
FIG. 17 illustrates a first embodiment of the present invention.

In a first embodiment shown in FIG. 17, the walls 71, 73 of the vaporization chamber 72 are laid down in gold on substrate or die 28. The material of the barrier layer 30 is completely replaced with gold to construct the ink ejection chamber 72. Thus, the gold thickness is of the order of 15 $\mu$m with the exact value depending on the printhead architecture. The side walls 71 and rear wall 73 of the vaporization chamber 72 form a gold weld line pattern 210 on the barrier layer 30. A corresponding mating gold weld line pattern 208 is laid on the flex circuit 18 to match the outline or area of the vaporization chamber 72. This weld seam 208 is made of copper laid on a chromium seed layer and coated with gold to prevent corrosion. The substrate 30 and flex circuit 18 are precisely aligned and welded using the FPC laser welding system and technique as described above. The position of the FPC probe is moved along the weld seam, to create a weld line, by using overlapping patterns of spot welds. The advantages of this embodiment are resistance to corrosion and delamination resulting in better reliability, and better stiffness, resulting in better dot placement and refill performances, thereby resulting in better print quality.

Figure 18:
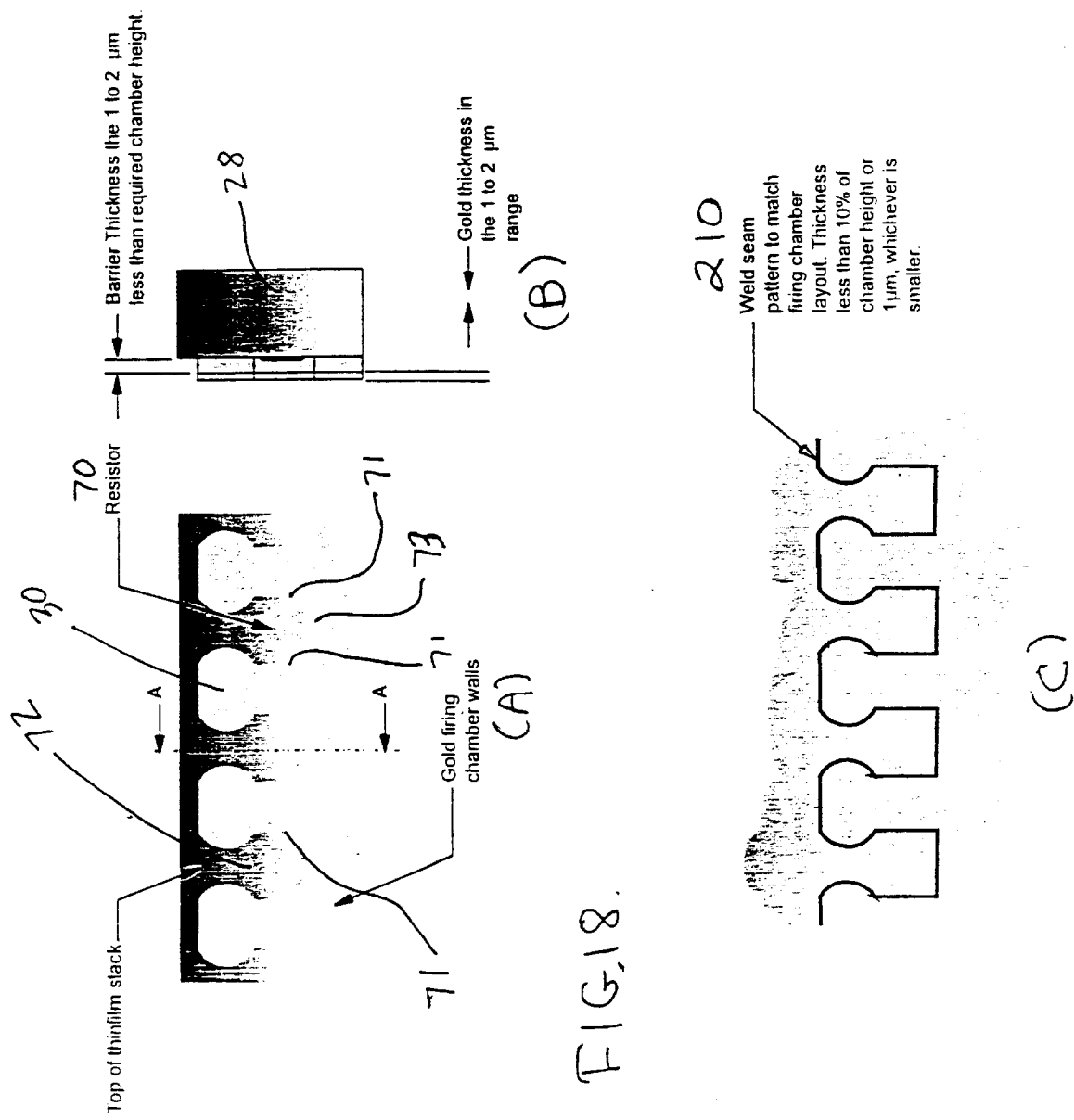
FIG. 18 illustrates a variation of the FIG. 17 embodiment.

A modified form of this embodiment is shown in FIG. 18. In this variation the top 1 to 2 $\mu$m of the barrier structure 30 is replaced with 1 to 2 $\mu$m of gold. A weld seam pattern 208 is laid on the flex circuit 18 to match the outline of the vaporization chamber 72. This weld seam 208 is made of copper laid on a chromium seed layer and coated with gold to prevent corrosion. The substrate 28 and the flex 18 are precisely aligned and welded using the FPC welding system. The position of the FPC probe is moved along the weld seam, to create a weld line, by using overlapping patterns of spot welds. The main advantage of this embodiment is better stiffness, resulting in better dot placement and refill performances, thereby resulting in better print quality.

Figure 19:
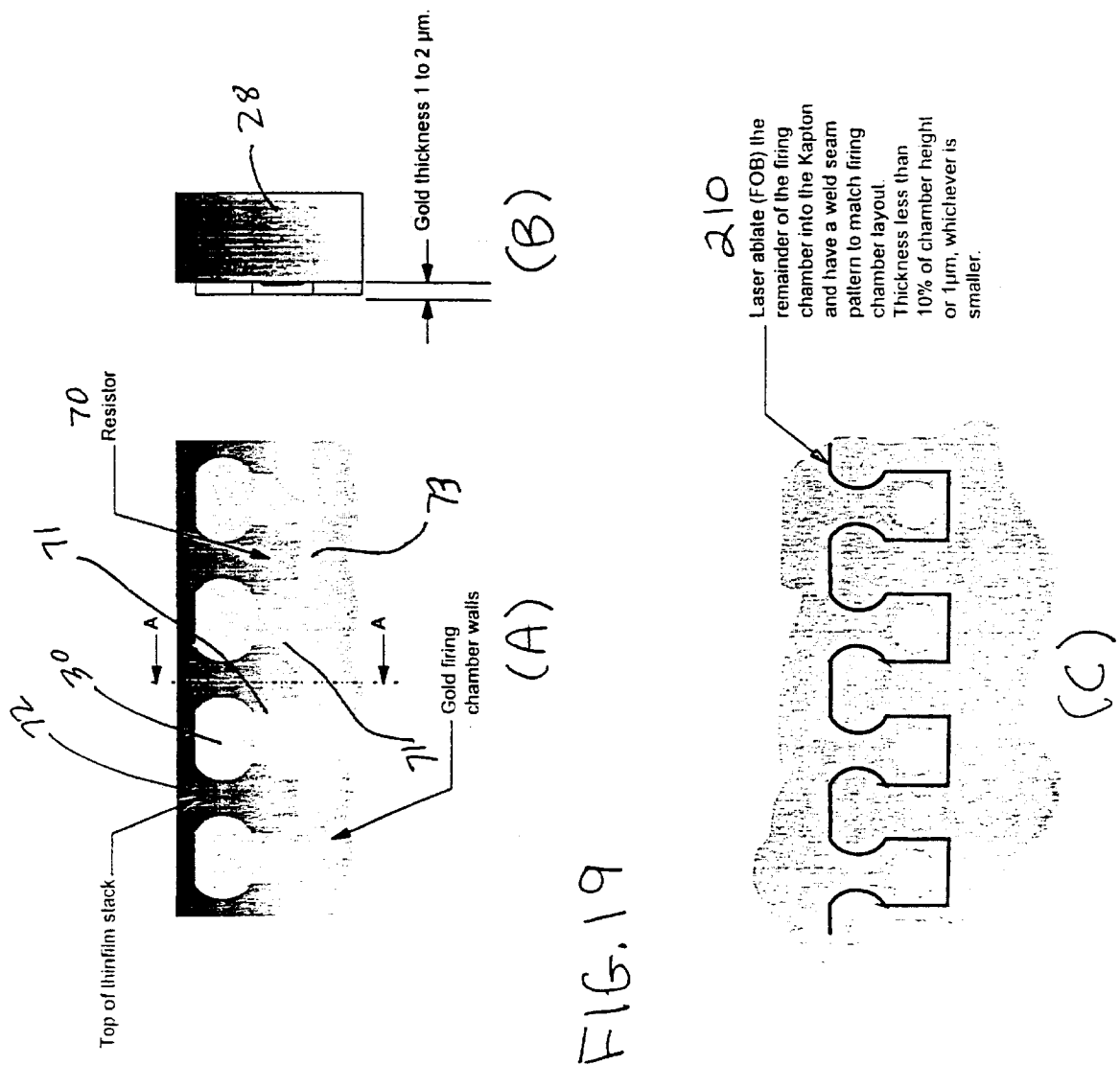
FIG. 19 illustrates a second embodiment of the present invention.

In a second embodiment shown in FIG. 19, the walls 71, 73 of the vaporization chamber 72 are again laid in gold on substrate or die 28. However, in this case the height of the vaporization chamber 72 on the substrate is in the order of 1 to 2 $\mu$m. This embodiment is advantageous if plating up to the wall 71 height thicknesses of approximately 15 microns are difficult for the manufacturing process to handle. Again the pattern of the vaporization chamber walls 71, 73 laid out in gold on the surface of the barrier layer 30 forms a gold weld line pattern 210. The remainder of the vaporization chamber 72 is formed by ablating a recess on the flex 18 to match the ink chamber layout of the gold barrier. A corresponding mating gold weld seam pattern 208 is laid on the flex circuit 18. This weld seam is made of copper laid on a chromium seed layer and coated with gold to prevent corrosion. The substrate 30 and the flex 18 are precisely aligned and welded using the FPC welding system. The position of the FPC probe is moved along the weld seam, to create a weld line, by using overlapping patterns of spot welds. The advantages of this embodiment are resistance to corrosion and delamination resulting in better reliability, better stiffness, resulting in better dot placement and refill performances, thereby resulting in better print quality.

Figure 20:
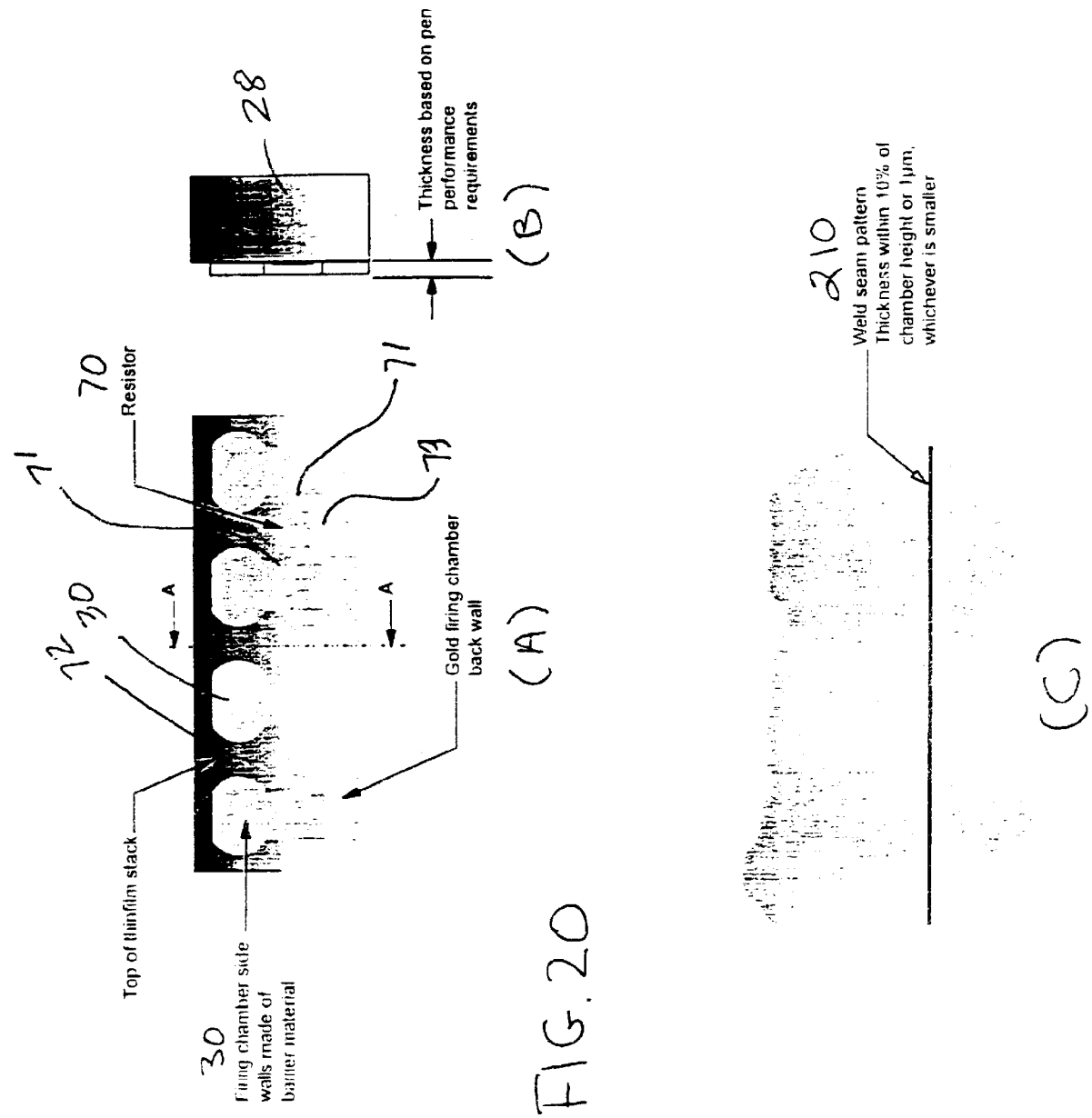
FIG. 20 illustrates a third embodiment of the present invention.

In a third embodiment shown in FIG. 20, the side walls 71 of the vaporization chambers 72 are made of the barrier material 30 and the critical back wall 73 is fabricated completely out of gold. A corresponding mating gold weld seam pattern 208 is laid on the flex circuit 18 to match the outline of the vaporization chamber back wall 73. This weld seam is made of copper laid on a chromium seed layer and coated with gold to prevent corrosion. The substrate 30 and flex circuit 18 are precisely aligned and welded using the FPC laser welding system. The position of the FPC probe is moved along the seam, to create a weld line, by using overlapping patterns of spot welds. The advantages of this embodiment are resistance to corrosion and delamination resulting in better reliability, and better stiffness, resulting in better dot placement and refill performances, thereby resulting in better print quality.

Figure 21:
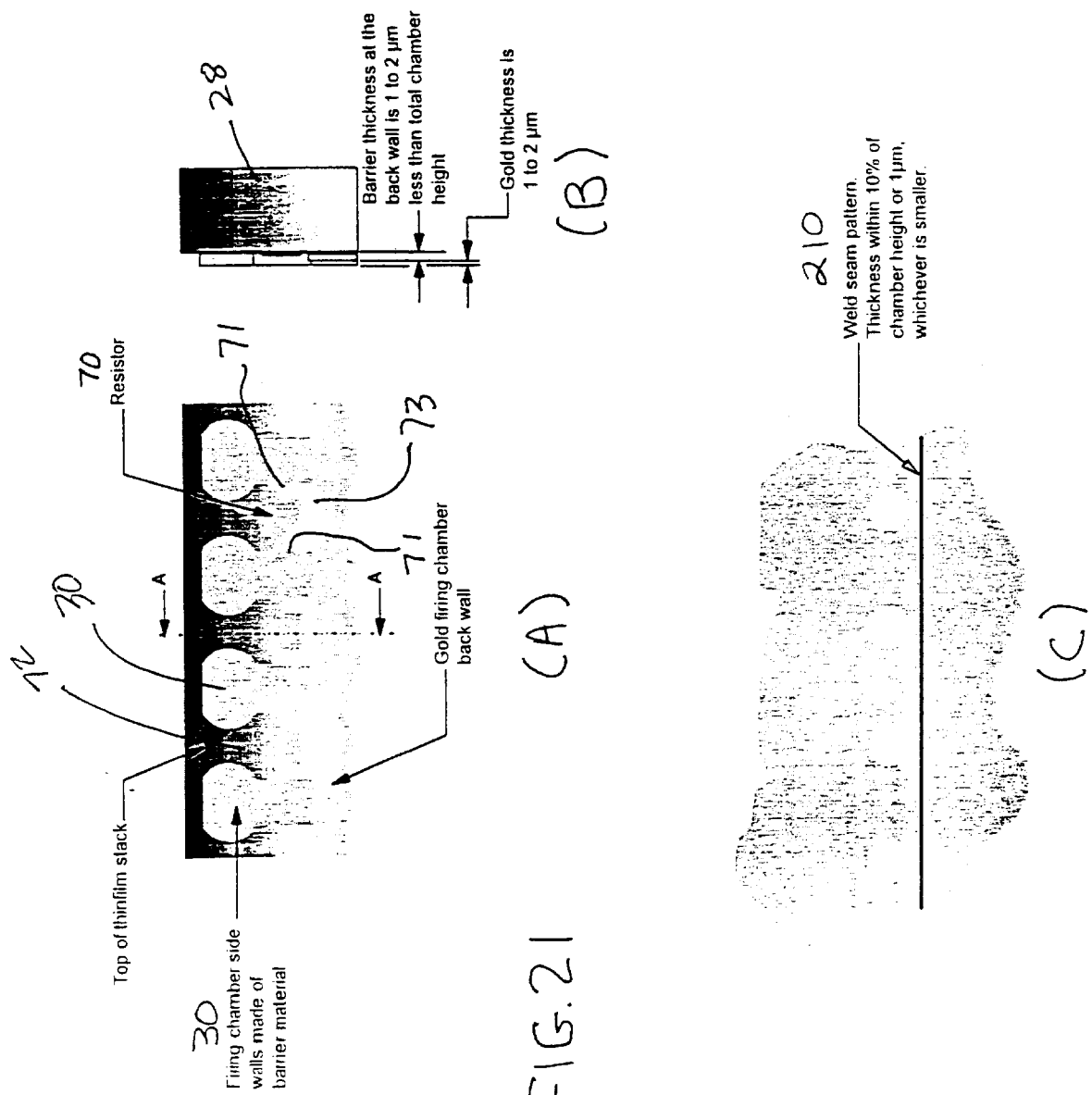
FIG. 21 illustrates a variation of the FIG. 20 embodiment.

A variation of this embodiment, shown in FIG. 21, is to build only the top 1 to 2 $\mu$m of the back wall 73 barrier structure with gold. A weld seam pattern 208 is laid on the flex circuit 18 to match the outline of the vaporization chamber back wall 73. This weld seam is made of copper laid on a chromium seed layer and coated with gold to prevent corrosion. The substrate and the flex are precisely aligned and welded using the FPC welding system. The position of the FPC probe is moved along the weld seam, to create a weld line, by using overlapping patterns of spot welds. The main advantage of this embodiment is better stiffness, resulting in better dot placement and refill performances, thereby resulting in better print quality.

Figure 22:
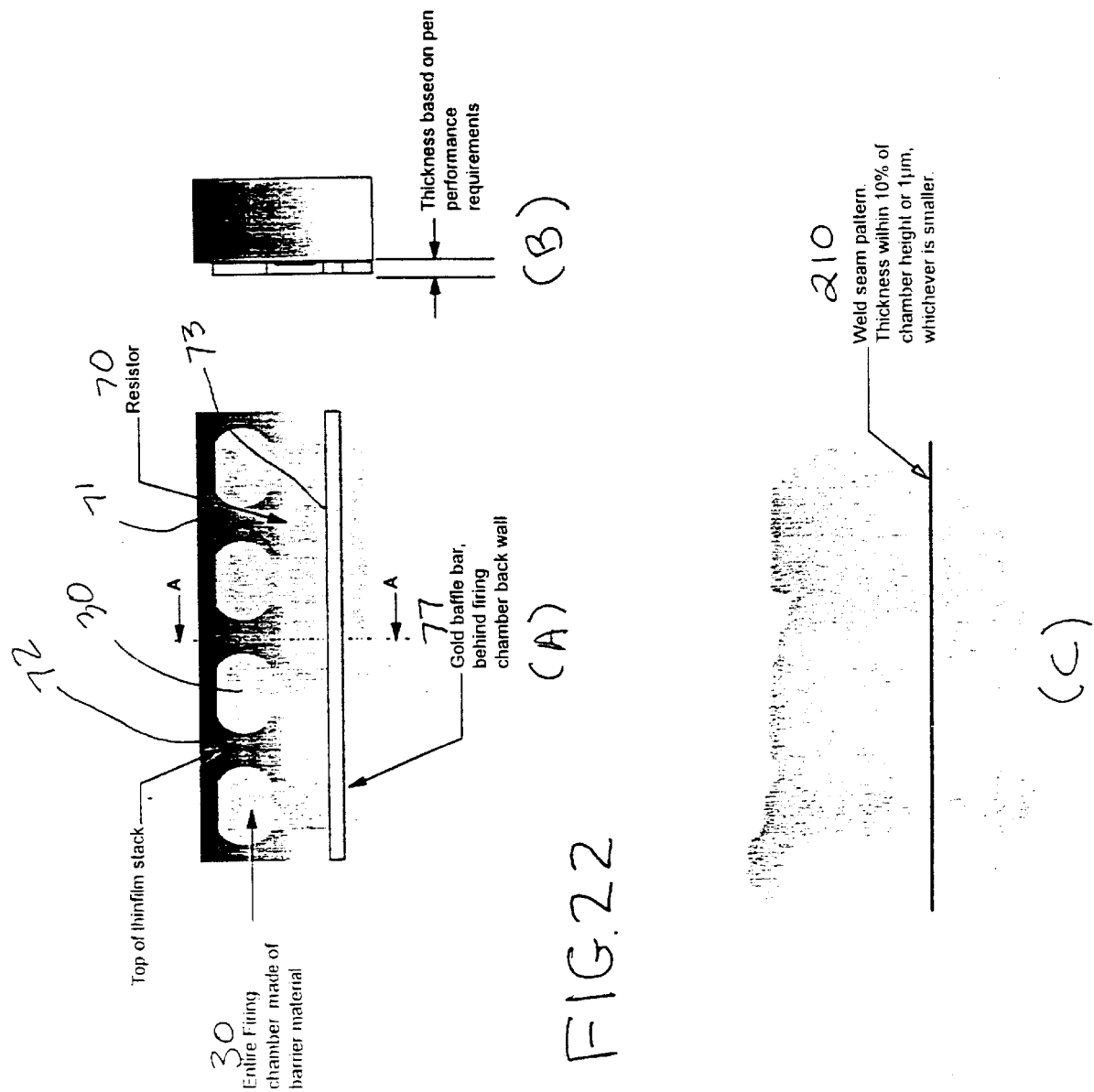
FIG. 22 illustrates a fourth embodiment of the present invention.

In a fourth embodiment shown in FIG. 22, the entire vaporization chamber 72 is built out of barrier material, but a straight gold baffle bar 77 is formed behind the back walls 73 of the vaporization chambers 72 to form gold weld line pattern 210. This baffle structure 77 is built slightly behind the back wall 73. This baffle structure 77 can be fabricated either by placing a thin 1–2 $\mu$m gold weld seam pattern 210 on the substrate 30 and a thick (same thickness as the vaporization chamber 72) weld trace on the flex 18 or by laying a thick gold structure (same thickness as the vaporization chamber 72) on the substrate 30 and a 1–2 $\mu$m weld seam line 208 on the flex 18. The thickness in traces can also be shared between the substrate 30 and the flex 18 to meet specific design rules for the product and process. The main advantage of this embodiment is better stiffness, resulting in better dot placement and refill performances, thereby resulting in better print quality.

In each of the above embodiments, the FPC laser is used to form a full weld along the gold weld lines or weld patterns 208, 210. Experimental results show that average peel strengths using FPC laser welding are 18.3 lbs. versus 3.6 lbs. for conventional adhesive bonding.

Thereafter the tape 104 steps forward and is optionally taken up on the take-up reel 124. The tape 104 may then later be cut to separate the individual TAB head assemblies from one another.

The resulting TAB head assembly is then positioned on the print cartridge 10, and the previously described adhesive seal 90 is formed to firmly secure the nozzle member to the print cartridge, provide an ink-proof seal around the substrate between the nozzle member and the ink reservoir, and encapsulate the traces in the vicinity of the headland so as to isolate the traces from the ink.

Peripheral points on the flexible TAB head assembly are then secured to the plastic print cartridge 10 by a conventional melt-through type bonding process to cause the polymer flexible circuit 18 to remain relatively flush with the surface of the print cartridge 10, as shown in FIG. 1.

The foregoing has described the principles, preferred embodiments and modes of operation of the present invention. However, the invention should not be construed as being limited to the particular embodiments discussed. As an example, while the present invention was described in conjunction with the laser welding of a TAB circuit to the silicon substrate of an inkjet printhead, the present method and apparatus for the solderless laser welding of two materials by using a laser light beam attached to a fiber optic system is applicable to laser welding of other types of materials to each other. Likewise, while the present invention was described in conjunction with solderless gold to gold laser welding of two materials to each other, the present method could be used for the solderless laser welding using other conductive metals. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method for fastening of a TAB circuit to another article, substantially distinct from formation of any functional electrical connections therebetween; said method comprising the steps of:

providing a weldable-metal pattern on a surface of the TAB circuit; and laser welding the weldable-metal pattern to the other article by directing a laser beam to heat the pattern.

2. The method of claim 1, wherein:

although substantially distinct from formation of any functional electrical connections, performance of at least one of the steps of the method is simultaneous or substantially concurrent with steps in formation of functional electrical connections between the TAB circuit and the other article.

3. The method of claim 1:

wherein the other article is not an electrical conductor; and comprising the further step of providing a second weldable-metal pattern on the surface of the other article; and wherein the laser welding step comprises welding the first-mentioned weldable-metal pattern to the second weldable-metal pattern.

4. The method of claim 3, further comprising the step of:

before the first-mentioned pattern providing step, providing on the TAB circuit a pattern of seed metal to underlie the weldable-metal pattern on the TAB circuit and control localization of laser-beam absorption;

said seed metal having a suitable absorption at the wavelength of the laser beam.

5. The method of claim 4, further comprising the step of:

before and during at least part of the welding step, using an optical fiber to hold the weldable-metal patterns in contact at a bond surface; and wherein the directing step comprises directing the laser beam to the seed-metal pattern through the optical fiber.

6. The method of claim 5, wherein:

the directing step comprises directing the laser beam to the seed-metal pattern through bulk material of the TAB circuit.

7. The method of claim 4, further comprising the step of:

before the welding step, substantially aligning the weldable-metal patterns on the surfaces of the first and second materials respectively.

8. The method of claim 7, wherein:

the directing step comprises directing the laser beam to the weldable-metal pattern through bulk material of the TAB circuit.

9. The method of claim 3, for use with said second article that comprises a silicon substrate, and wherein:

said second-pattern providing step comprises providing a weldable-metal pattern on the surface of the silicon substrate.

10. The method of claim 3, for use with said second article that comprises a substrate of an inkjet printhead, and wherein:

said second-pattern providing step comprises providing a weldable-metal pattern on the surface of the printhead substrate.

11. The method of claim 1, further comprising the step of:

before and during at least part of the welding step, using an optical fiber to hold the weldable-metal pattern in contact with the other article at a bond surface; and wherein the directing step comprises directing the laser beam to the weldable-metal pattern through the optical fiber.

12. The method of claim 1, wherein:

the directing step comprises directing the laser beam to the weldable-metal pattern through bulk material of the TAB circuit.

13. A method of formation of an inkjet-printhead assembly that includes a TAB circuit and a substrate, said method being substantially distinct from formation of functional electrical connections between the TAB circuit and substrate; said method comprising the steps of:

providing a first weldable-metal pattern on a surface of the TAB circuit;

providing a second weldable-metal pattern on or in the substrate; and laser welding the metal patterns to each other by directing the laser beam to heat the pattern on the TAB circuit.

14. The method of claim 13, wherein:

although substantially distinct from formation of any functional electrical connections, performance of at least some of the steps of the method is simultaneous or substantially concurrent with steps in formation of functional electrical connections between the TAB circuit and the substrate.

15. The method of claim 13, for use with a substrate that includes a barrier layer having an upstanding barrier-layer pattern to define ink chambers and channels; and:

further comprising the step of, before the second-pattern providing step, providing a seed-metal pattern on the surface of the TAB circuit, to underlie the weldable-metal pattern; and wherein the second-pattern providing step comprises forming the second pattern in accordance with at least a portion of the barrier-layer pattern.

16. The method of claims 13, further comprising:

before the second-pattern providing step, providing a seed-metal pattern on the surface of the TAB circuit, to underlie the weldable-metal pattern.

17. The method of claim 13, for use with a substrate that includes a barrier layer having an upstanding barrier-layer pattern to define ink chambers and channels; and wherein:

the second-pat-tern providing step comprises forming the second pattern in accordance with at least a portion of the barrier-layer pattern.

18. The method of claim 17, wherein:

the second-pattern providing step comprises substantially applying the second weldable metal to the top of the barrier layer.

19. The method of claim 17, wherein:

the second-pattern providing step comprises substantially applying the second weldable metal to the substrate, to form at least the ink chambers and channels of the barrier layer.

20. The method of claim 19, further comprising the step of:

forming a structure of cavities in material of the TAB tape, aligned with the chambers and channels of the barrier layer, to effectively enlarge the chambers and channels.

21. The method of claim 20, wherein:

the cavity-structure forming step comprises laser ablation of the TAB-tape material.

22. The method of claim 17, wherein:

the second-pattern providing step comprises substantially applying the second weldable metal to form a structure that is generally aligned with a major feature of the barrier-layer pattern.

23. The method of claim 22, wherein:

the second-pattern providing step comprises substantially applying the second weldable metal to form a bulkhead that is behind and extends generally parallel to rear walls of ink-ejection chambers of the barrier layer.

24. The method of claim 17, wherein:

the second-pattern providing step comprises substantially applying the second weldable metal to form a structure that generally reenforces a major feature of the barrier-layer pattern.

25. The method of claim 15, further comprising the step of:

forming a structure of cavities in material of the TAB tape, aligned with chambers and channels of the barrier layer, to effectively enlarge the chambers and channels.

26. The method of claim 25, wherein:

the cavity-structure forming step comprises laser ablation of the TAB-tape material.

27. The method of claim 17, wherein:

although substantially distinct from formation of any functional electrical connections, performance of at least some of the steps of the method is simultaneous or substantially concurrent with steps in formation of functional electrical connections between the TAB circuit and the substrate.

\* \* \* \* \*

UNITED STATES PATENT AND TRADEMARK OFFICE
CERTIFICATE OF CORRECTION

PATENT NO.     : 6,380,511 B1
DATED          : April 30, 2002
INVENTOR(S)    : Santhanam It is certified that error appears in the above-identified patent and that said Letters Patent is hereby corrected as shown below:

<u>Title page,</u>
Item [62], Related U.S. Application Data, delete "5,847,365" and insert in lieu thereof -- 5,847,356 --.

<u>Column 1,</u>
Line 11, delete "5,347,355" and insert in lieu thereof -- 5,847,356 --.

Signed and Sealed this

Sixteenth Day of December, 2003

JAMES E. ROGAN
*Director of the United States Patent and Trademark Office*